(12) United States Patent
Dulkin et al.

(10) Patent No.: US 7,855,147 B1
(45) Date of Patent: Dec. 21, 2010

(54) METHODS AND APPARATUS FOR ENGINEERING AN INTERFACE BETWEEN A DIFFUSION BARRIER LAYER AND A SEED LAYER

(75) Inventors: Alexander Dulkin, Sunnyvale, CA (US); Asit Rairkar, Santa Clara, CA (US); Frank Greer, Portola Valley, CA (US); Anshu A. Pradhan, San Jose, CA (US); Robert Rozbicki, San Francisco, CA (US)

(73) Assignee: Novellus Systems, Inc., San Jose, CA (US)

( * ) Notice: Subject to any disclaimer, the term of this patent is extended or adjusted under 35 U.S.C. 154(b) by 514 days.

(21) Appl. No.: 11/807,178

(22) Filed: May 24, 2007

Related U.S. Application Data

(63) Continuation-in-part of application No. 11/473,618, filed on Jun. 22, 2006, now Pat. No. 7,645,696.

(51) Int. Cl.
*H01L 21/44* (2006.01)

(52) U.S. Cl. .............. 438/676; 438/679; 257/E21.161; 257/E21.169; 257/E21.295

(58) Field of Classification Search .................. None
See application file for complete search history.

(56) References Cited

U.S. PATENT DOCUMENTS

| | | |
|---|---|---|
| 3,763,031 A | 10/1973 | Scow et al. |
| 3,767,551 A | 10/1973 | Lang et al. |
| 584,430 A | 11/1977 | Suntola et al. |
| 4,058,430 A | 11/1977 | Suntola et al. |
| 4,392,111 A | 7/1983 | Rostoker |
| 4,492,620 A | 1/1985 | Matsuo et al. |
| 4,588,490 A | 5/1986 | Cuomo et al. |
| 4,604,180 A | 8/1986 | Hirukawa et al. |
| 4,609,903 A | 9/1986 | Toyokura et al. |
| 4,622,121 A | 11/1986 | Wegmann et al. |
| 4,737,384 A | 4/1988 | Murthy et al. |
| 4,874,493 A | 10/1989 | Pan |
| 4,963,524 A | 10/1990 | Yamazaki |
| 4,999,096 A | 3/1991 | Nihei et al. |
| 5,009,963 A | 4/1991 | Ohmi et al. |

(Continued)

FOREIGN PATENT DOCUMENTS

CN    1567548 A  *  1/2005

(Continued)

OTHER PUBLICATIONS

Wu et al., "Deposition of Doped Copper Seed Layers Having Improved Reliability," Novellus Systems, Inc., U.S. Appl. No. 12/122,118, filed May 16, 2008.

(Continued)

*Primary Examiner*—David E Graybill
(74) *Attorney, Agent, or Firm*—Weaver Austin Villeneuve & Sampson LLP

(57) ABSTRACT

Copper seed layers are formed on diffusion barrier layers (e.g., on Ta, and $TaN_x$ layers) without significant agglomeration of copper, with the use of an engineered barrier layer/seed layer interface. The engineered interface includes an adhesion layer, in which copper atoms are physically trapped and are prevented from migrating and agglomerating. The adhesion layer can include between about 20-80% atomic of copper. The copper atoms of the adhesion layer are exposed during deposition of a copper seed layer and serve as the nucleation sites for the deposited copper. Thin, continuous, and conformal seed layers can be deposited on top of the adhesion layer. The trapping of copper within the adhesion layer is achieved by intermixing diffusion barrier and seed layer materials using PVD and/or ALD.

41 Claims, 18 Drawing Sheets

U.S. PATENT DOCUMENTS

| | | |
|---|---|---|
| 5,084,412 A | 1/1992 | Nakasaki |
| 5,126,028 A | 6/1992 | Hurwitt et al. |
| 5,139,825 A | 8/1992 | Gordon et al. |
| 5,178,739 A | 1/1993 | Barnes et al. |
| 5,194,398 A | 3/1993 | Miyachi et al. |
| 5,221,449 A | 6/1993 | Colgan et al. |
| 5,281,485 A | 1/1994 | Colgan et al. |
| 5,298,091 A | 3/1994 | Edwards, III et al. |
| 5,378,506 A | 1/1995 | Imai et al. |
| 5,482,611 A | 1/1996 | Helmer et al. |
| 5,622,608 A | 4/1997 | Lanford et al. |
| 5,629,221 A | 5/1997 | Chao et al. |
| 5,654,233 A | 8/1997 | Yu |
| 5,656,860 A | 8/1997 | Lee |
| 5,766,379 A | 6/1998 | Lanford et al. |
| 5,789,027 A | 8/1998 | Watkins et al. |
| 5,801,089 A | 9/1998 | Kenney |
| 5,904,565 A | 5/1999 | Nguyen et al. |
| 5,948,215 A | 9/1999 | Lantsman |
| 5,962,923 A | 10/1999 | Xu et al. |
| 5,969,422 A | 10/1999 | Ting et al. |
| 5,985,762 A | 11/1999 | Geffken et al. |
| 6,037,257 A | 3/2000 | Chiang et al. |
| 6,046,108 A | 4/2000 | Liu et al. |
| 6,074,544 A | 6/2000 | Reid et al. |
| 6,077,403 A | 6/2000 | Kobayashi et al. |
| 6,077,780 A | 6/2000 | Dubin |
| 6,080,285 A | 6/2000 | Liu et al. |
| 6,093,966 A | 7/2000 | Venkatraman et al. |
| 6,099,702 A | 8/2000 | Reid et al. |
| 6,100,200 A | 8/2000 | Van Buskirk et al. |
| 6,105,078 A * | 8/2000 | Crockett et al. ................ 710/18 |
| 6,110,346 A | 8/2000 | Reid et al. |
| 6,114,238 A | 9/2000 | Liao |
| 6,120,641 A | 9/2000 | Stevens et al. |
| 6,124,203 A | 9/2000 | Joo et al. |
| 6,126,798 A | 10/2000 | Reid et al. |
| 6,139,712 A | 10/2000 | Patton et al. |
| 6,147,000 A | 11/2000 | You et al. |
| 6,156,167 A | 12/2000 | Patton et al. |
| 6,159,354 A | 12/2000 | Contolini et al. |
| 6,159,857 A | 12/2000 | Liu et al. |
| 6,162,344 A | 12/2000 | Reid et al. |
| 6,179,973 B1 | 1/2001 | Lai et al. |
| 6,179,983 B1 | 1/2001 | Reid et al. |
| 6,193,854 B1 | 2/2001 | Lai et al. |
| 6,200,893 B1 | 3/2001 | Sneh |
| 6,203,613 B1 | 3/2001 | Gates et al. |
| 6,217,716 B1 | 4/2001 | Fai Lai |
| 6,221,757 B1 | 4/2001 | Schmidbauer et al. |
| 6,228,754 B1 | 5/2001 | Iacoponi et al. |
| 6,235,163 B1 | 5/2001 | Angelo et al. |
| 6,249,055 B1 | 6/2001 | Dubin |
| 6,251,242 B1 | 6/2001 | Fu et al. |
| 6,265,313 B1 * | 7/2001 | Huang et al. ................ 438/687 |
| 6,271,591 B1 | 8/2001 | Dubin et al. |
| 6,274,008 B1 | 8/2001 | Gopalraja et al. |
| 6,277,249 B1 | 8/2001 | Gopalraja et al. |
| 6,280,597 B1 | 8/2001 | Kashiwada et al. |
| 6,287,977 B1 | 9/2001 | Hashim et al. |
| 6,333,547 B1 | 12/2001 | Tanaka et al. |
| 6,340,435 B1 | 1/2002 | Bjorkman et al. |
| 6,342,133 B2 | 1/2002 | D'Couto et al. |
| 6,342,448 B1 | 1/2002 | Lin et al. |
| 6,350,353 B2 | 2/2002 | Gopalraja et al. |
| 6,358,376 B1 | 3/2002 | Wang et al. |
| 6,387,805 B2 | 5/2002 | Ding et al. |
| 6,391,785 B1 | 5/2002 | Satta et al. |
| 6,395,642 B1 | 5/2002 | Liu et al. |
| 6,402,907 B1 | 6/2002 | Rich |
| 6,417,094 B1 | 7/2002 | Zhao et al. |
| 6,436,251 B2 * | 8/2002 | Gopalraja et al. ...... 204/298.12 |
| 6,440,854 B1 | 8/2002 | Rozbicki |
| 6,444,104 B2 * | 9/2002 | Gopalraja et al. ...... 204/298.13 |
| 6,448,176 B1 | 9/2002 | Grill et al. |
| 6,451,177 B1 | 9/2002 | Gopalraja et al. |
| 6,492,262 B2 | 12/2002 | Uzoh |
| 6,498,091 B1 | 12/2002 | Chen et al. |
| 6,500,762 B2 | 12/2002 | Hashim et al. |
| 6,509,267 B1 | 1/2003 | Woo et al. |
| 6,538,324 B1 | 3/2003 | Tagami et al. |
| 6,541,374 B1 | 4/2003 | de Felipe et al. |
| 6,554,914 B1 | 4/2003 | Rozbicki et al. |
| 6,559,061 B2 | 5/2003 | Hashim et al. |
| 6,562,715 B1 | 5/2003 | Chen et al. |
| 6,566,246 B1 | 5/2003 | de Felipe et al. |
| 6,589,887 B1 | 7/2003 | Dalton et al. |
| 6,605,534 B1 | 8/2003 | Chung et al. |
| 6,607,977 B1 * | 8/2003 | Rozbicki et al. ............ 438/627 |
| 6,607,982 B1 | 8/2003 | Powell et al. |
| 6,613,199 B1 | 9/2003 | Tobin et al. |
| 6,624,066 B2 | 9/2003 | Lu et al. |
| 6,642,146 B1 * | 11/2003 | Rozbicki et al. ............ 438/687 |
| 6,652,718 B1 | 11/2003 | D'Couto et al. |
| 6,656,841 B1 | 12/2003 | Kim |
| 6,660,622 B2 | 12/2003 | Chen et al. |
| 6,673,716 B1 | 1/2004 | D'Couto et al. |
| 6,683,425 B1 | 1/2004 | Lai |
| 6,706,142 B2 | 3/2004 | Savas et al. |
| 6,706,155 B2 | 3/2004 | Morimoto et al. |
| 6,709,557 B1 | 3/2004 | Kailasam et al. |
| 6,709,987 B2 | 3/2004 | Hashim et al. |
| 6,755,945 B2 * | 6/2004 | Yasar et al. ............... 204/192.3 |
| 6,758,947 B2 | 7/2004 | Chiang et al. |
| 6,764,940 B1 | 7/2004 | Rozbicki et al. |
| 6,784,096 B2 | 8/2004 | Chen et al. |
| 6,790,776 B2 | 9/2004 | Ding et al. |
| 6,841,044 B1 | 1/2005 | Ruzic |
| 6,893,541 B2 | 5/2005 | Chiang et al. |
| 6,905,965 B2 | 6/2005 | Subrahmanyan et al. |
| 6,919,275 B2 | 7/2005 | Chiang et al. |
| 6,943,111 B2 | 9/2005 | Lin et al. |
| 6,949,457 B1 | 9/2005 | Fiordalice et al. |
| 6,969,448 B1 | 11/2005 | Lau |
| 6,992,012 B2 | 1/2006 | Hashim et al. |
| 7,030,031 B2 | 4/2006 | Wille et al. |
| 7,037,830 B1 | 5/2006 | Rumer et al. |
| 7,048,837 B2 | 5/2006 | Somekh et al. |
| 7,074,714 B2 | 7/2006 | Chiang et al. |
| 7,135,402 B2 | 11/2006 | Lin et al. |
| 7,186,648 B1 | 3/2007 | Rozbicki et al. |
| 7,253,109 B2 | 8/2007 | Ding et al. |
| 7,294,574 B2 | 11/2007 | Ding et al. |
| 7,365,001 B2 | 4/2008 | Yang et al. |
| 7,510,634 B1 | 3/2009 | Klawuhn et al. |
| 7,645,696 B1 * | 1/2010 | Dulkin et al. ............... 438/637 |
| 7,659,197 B1 | 2/2010 | Juliano |
| 7,682,966 B1 | 3/2010 | Rozbicki et al. |
| 2001/0039113 A1 | 11/2001 | Blalock et al. |
| 2002/0000382 A1 | 1/2002 | Morrissey et al. |
| 2002/0028576 A1 * | 3/2002 | Hashim et al. ............... 438/653 |
| 2002/0041028 A1 | 4/2002 | Choi et al. |
| 2002/0110999 A1 | 8/2002 | Lu et al. |
| 2002/0115287 A1 * | 8/2002 | Hashim et al. ............... 438/653 |
| 2003/0034244 A1 | 2/2003 | Yasar et al. |
| 2003/0116427 A1 | 6/2003 | Ding et al. |
| 2003/0129828 A1 | 7/2003 | Cohen |
| 2003/0216035 A1 * | 11/2003 | Rengarajan et al. ......... 438/637 |
| 2004/0048461 A1 | 3/2004 | Chen |
| 2004/0094402 A1 * | 5/2004 | Gopalraja et al. ...... 204/192.12 |
| 2004/0152301 A1 * | 8/2004 | Hashim et al. ............... 438/652 |
| 2004/0171250 A1 | 9/2004 | Chiang et al. |
| 2004/0188239 A1 | 9/2004 | Robison et al. |
| 2004/0211661 A1 | 10/2004 | Zhang et al. |

| | | | |
|---|---|---|---|
| 2004/0224507 | A1 | 11/2004 | Marieb et al. |
| 2004/0266175 | A1* | 12/2004 | Chen et al. .................. 438/629 |
| 2005/0006222 | A1 | 1/2005 | Ding et al. |
| 2005/0020080 | A1 | 1/2005 | Chiang et al. |
| 2005/0032382 | A1 | 2/2005 | Rossman |
| 2005/0085068 | A1 | 4/2005 | Chiang et al. |
| 2005/0085070 | A1 | 4/2005 | Park |
| 2005/0103620 | A1 | 5/2005 | Chistyakov |
| 2005/0106865 | A1* | 5/2005 | Chung et al. ................ 438/685 |
| 2005/0110147 | A1 | 5/2005 | Wu et al. |
| 2005/0173239 | A1 | 8/2005 | Somekh et al. |
| 2005/0186793 | A1 | 8/2005 | Omoto et al. |
| 2005/0211545 | A1 | 9/2005 | Cerio, Jr. et al. |
| 2005/0252765 | A1 | 11/2005 | Zhang et al. |
| 2005/0255690 | A1 | 11/2005 | Chen et al. |
| 2005/0255691 | A1 | 11/2005 | Ding et al. |
| 2005/0255700 | A1* | 11/2005 | Gopalraja et al. ........... 438/687 |
| 2005/0266682 | A1 | 12/2005 | Chen et al. |
| 2005/0272254 | A1 | 12/2005 | Ding et al. |
| 2006/0014378 | A1 | 1/2006 | Aggarwal et al. |
| 2006/0024953 | A1 | 2/2006 | Rao et al. |
| 2006/0030151 | A1 | 2/2006 | Ding et al. |
| 2006/0057843 | A1 | 3/2006 | Chen et al. |
| 2006/0125100 | A1* | 6/2006 | Arakawa .................... 257/758 |
| 2006/0148253 | A1* | 7/2006 | Chung et al. ................ 438/681 |
| 2006/0207873 | A1 | 9/2006 | Fu |
| 2006/0258152 | A1* | 11/2006 | Haider ....................... 438/644 |
| 2007/0020922 | A1 | 1/2007 | Chiang et al. |
| 2007/0178682 | A1 | 8/2007 | Chiang et al. |
| 2007/0193982 | A1 | 8/2007 | Brown et al. |
| 2007/0197012 | A1* | 8/2007 | Yang et al. .................. 438/597 |
| 2007/0283886 | A1 | 12/2007 | Chung et al. |
| 2008/0110747 | A1* | 5/2008 | Ding et al. ............. 204/192.17 |
| 2008/0142359 | A1* | 6/2008 | Gopalraja et al. ...... 204/298.16 |
| 2008/0190760 | A1 | 8/2008 | Tang et al. |
| 2008/0310005 | A1 | 12/2008 | Tonar et al. |
| 2009/0233438 | A1* | 9/2009 | Ding et al. .................. 438/627 |

FOREIGN PATENT DOCUMENTS

| | | |
|---|---|---|
| EP | 0 692 551 A1 | 1/1996 |
| JP | 11-186273 | 9/1999 |

OTHER PUBLICATIONS

U.S. Office Action mailed Jun. 26, 2008, from U.S. Appl. No. 11/473,618.

U.S. Office Action mailed May 2, 2008, from U.S. Appl. No. 11/558,693.

U.S. Office Action mailed Dec. 12, 2008, from U.S. Appl. No. 11/714,465.

Notice of Allowance and Fee Due mailed Nov. 24, 2008, from U.S. Appl. No. 11/558,693.

Allowed Claims from U.S. Appl. No. 11/558,693.

U.S. Final Office Action mailed Dec. 10, 2008, from U.S. Appl. No. 11/473,618.

U.S. Office Action mailed Nov. 14, 2008, from U.S. Appl. No. 11/701,984.

Notice of Allowance and Fee Due mailed Apr. 13, 2004, from U.S. Appl. No. 10/412,562.

Allowed Claims from U.S Appl. No. 10/412,562.

Notice of Allowance and Fee Due mailed Oct. 3, 2006, from U.S. Appl. No. 10/804,353.

Allowed Claims from U.S. Appl. No. 10/804,353.

Wu et al., "Methods and Apparatus for Depositing Titanium Based Diffusion Barrier Films," Novellus Systems, Inc., U.S. Appl. No. 12/154,984, filed May 28, 2008.

Schumacher Products, TDEAT (Tetrakis-diethylamino Titanium), Electronic Grade, www.schumacher.com/tdeat.html, printed Jun. 5, 2001, 1 page.

Sun et al., Suppression of Cobalt Silicide Agglomeration Using Nitrogen (N2+) Implantation, IEEE Electron Device Letters, vol. 19, No. 5, May 1998, pp. 163-166.

Ashanti et al., "A New Hollow-Cathode Magnetron Source for 0.10. mu.m Copper Applications", Journal of Vacuum Science and Technology, A 18(4) Jul./Aug. 2000 p. 1546.

Cohen et al., "Reactive Preclean Technology for Nonphysical Copper Oxide Reduction for Advanced CU Interconnect", Jun. 16-18, 1998, VMIC Conference, pp. 91 and 93.

Jian Li and J. W. Mayer and E. G. Colgan, "Oxidation and Protection in Copper and Copper Alloy Thin Films", J. Appl. Phys. 70 (5), Sep. 1, 1991, pp. 2820-2827.

Ding et al., "Observation of Reduced Oxidation Rates for Plasma-Assisted CVD Copper Films", Mat. Res. Soc. Symp. Proc., vol. 309, 1993 pp. 445-460.

Klawuhn et al., "Ionized Physical-vapor deposition Using a Hollow-Cathode Magnetron Source for Advanced Metallization", J. Vac, Sci, Technol. A18(4), Jul./Aug. 2000, pp. 1546-1549.

M. Zinke-Allmang, "Phase Separation on Solid Surfaces: Nucleation, Coarsening and Coalescence Kinetics".

Peijun Ding, et al., "Copper Barrier, Seed Layer and Planarization Technologies," VMIC Conference, Jun. 10-12, 1997, pp. 87-92.

Tarek Suwwan de Felipe, et al., "Electrical Stability and Microstructual Evolution in Thin Films of High Conductivity Copper Alloys," IEEE, Jun. 1999, pp. 293-295.

Cho et al., "Factors Affecting Passivation and Resistivity of Cu(Mg) Alloy Film," Materials Research Society Symposium Proc. vol. 564, 1999, pp. 353-358.

Murarka et al., "Copper Metallization for ULSI and Beyond," Critical Reviews in Solid State and Materials Sciences, 1995, pp. 87-124.

Braeckelmann et al. "Integration and Reliability of Copper Magnesium Alloys for Multilevel Interconnects," IEEE, Feb. 2000, pp. 236-238.

Arcot et al., "Intermetallic Formation in Copper/Magnesium Thin Films—kinetics, Nucleation and Growth, and Effect of Interfacial Oxygen," J. Appl. Phys. 76(9), Nov. 1, 1994, pp. 5161-5170.

Ding et al., "Effects of the addition of small amounts of A1 to copper: Corrosion, resistivity, adhesion, morphology, and diffusion," J. Appl. Phys. 75(7), Apr. 1994, pp. 3627-3631.

T. Suwwan de Felipe et al., "Bias-temperature stability of the Cu(Mg)/SiO.sub.2/p-Si metal-oxide-semiconductor capacitors," J. Vac. Sci. Technol. B 15(6), Nov./Dec. 1997, pp. 1987-1986.

Chen et al. "Low Temperature Plasma-Assisted Chemical Vapor Deposition of Tantalum Nitride form Tantalum Pentabromide for Copper Metallization," Jan./Feb. 1999, J. Vac. Sci. Technol., B 17(1), pp. 182-185.

Cheng et al., "Directional Deposition of Cu into Semiconductor Trench Structures Using Ionized Magnetron Sputtering," Mar./Apr. 1995, J. Vac. Sci. Technol., B 13(2), pp. 203-208.

Cho et al., "Remote Plasma-Assisted Metal Organic Chemical Vapor Deposition of Tantalum Nitride Thin Films with Different Radicals," Dec. 1998, Jpn. J. Appl. Phys., vol. 37.

Endle et al., "X-Ray Photoelectron Spectroscopy Study on TiN Films Produced with Tetrakis (dimethylamido)Titanium and Selected N-Containing Precursors on SiO.sub.2," May/Jun. 1998, J. Vac. Sci. Technol., A 16(3), pp. 1262-1267.

Green et al., "Determination of Flux Ionization Fraction Using a Quartz Crystal Microbalance and a Gridded Energy Analyzer in an Ionized Magnetron Sputtering System," Dec. 1997, Rev. Sci. Instrum., 68 (12), pp. 4555-4560.

Han et al., "Barrier Metal Properties of Amorphous Tantalum Nitride Thin Films Between Platnium and Silicon Deposited Using Remote Plasma Metal Organic Chemical Vapor Method," May 1998, Jpn. J. Appl. Phys., vol. 37 (1998), Pt. 1, No. 5A, pp. 2646-2651.

Hayden et al., "Characterization of Magnetron-Sputtered Partially Ionized Aluminum Deposition," Mar./Apr. 1998, J. Vac. Sci. Technol., A 16(2), pp. 624-627.

Hayden et al., "Helion Plasma Source for Ionized Physical Vapor Deposition," 1999, Surface and Coatings Technology, 120-121 (1999), pp. 401-404.

Lee et al., "The Failure Mechanism of MOCVD TiN Diffusion Barrier at High Temperature," 1996, Mat. Res. Soc. Symp. Proc., vol. 324, pp. 279-284.

Lucovsky et al., "Formation of Thin Fims by Remote Plasma Enhanced Chemical Vapor Deposition (Remote PECVD)," Feb.

1990, in Handbook of Plasma Processing Technology, eds. Rossnagel, Cuomo and Westwood, Noyes Publications, pp. 387-408.

Musher et al., Atmospheric Pressure Chemical Vapor Deposition of Titanium Nitride from Tetrakis (diethylamido) Titanium and Ammonia, Feb. 1996, J. Electochem. Soc., vol. 143, No. 2, pp. 736-744.

Peng et al., "Structural and Electrical Properties of Chemical Vapor Deposition Tungsten Overgrowth on Physical Vapor Deposited and Metalorganic Chemical Vapor Deposited TiN Adhesion Layers," Jul./Aug. 1998, J. Vac. Sci. Technol., B 16(4), pp. 2013-2018.

Reif, Rafael, Plasma Enhanced Chemical Vapor Deposition of Thin Films for Microelectronics, Feb. 1990, in Handbook of Plasma Processing Technology, eds: Rossnagel, Cuomo and Westwood, Noyes Publications, pp. 260-284.

Truong, C.M.; Chen, P.J.; Corneille, J.S.; Oh, W.S. and Goodman, D.W., "Low-Pressure Deposition of TiN Thin Films from a Tetrakis (diethylamido) Titanium Precursor," 1995, *J. Phys. Chem.*, 1995, 99, pp. 8831-8842.

Tsai et al., "Comparison of the Diffusion Barrier Properties of Chemical-Vapor-Deposited TaN and Sputtered TaN Between Cu and Si," May 1996, J. Appl. Phys., 79 (9), pp. 6932-6938.

Danek et al., "Barrier First Method for Single Damascene Trench Applications," Novellus Systems, Inc., U.S. Appl. No. 11/714,465, filed Mar. 5, 2007.

U.S. Office Action mailed Jul. 31, 2002, from U.S. Appl. No. 09/862,539.

U.S. Office Action mailed Sep. 16, 2002, from U.S. Appl. No. 09/776,704.

U.S. Office Action mailed Apr. 22, 2002, from U.S. Appl. No. 09/776,704.

U.S. Final Office Action mailed Apr. 3, 2003, from U.S. Appl. No. 09/816,847.

U.S. Office Action mailed Oct. 4, 2002, from U.S. Appl. No. 09/816,847.

U.S. Office Action mailed Oct. 23, 2002, from U.S. Appl. No. 09/965,472.

U.S. Office Action mailed Oct. 3, 2003, from U.S. Appl. No. 10/412,562.

U.S. Final Office Action mailed Mar. 23, 2006, from U.S. Appl. No. 10/804,353.

U.S. Office Action mailed Oct. 3, 2006, from U.S. Appl. No. 10/804,353.

U.S. Office Action mailed Aug. 28, 2002, from U.S. Appl. No. 09/975,612.

U.S. Office Action mailed Jun. 15, 2004, from U.S. Appl. No. 10/289,237.

U.S. Office Action mailed Dec. 19, 2002, from U.S. Appl. No. 10/121,949.

Klawuhn et al., "Apparatus and Methods for Deposition and/or Etch Selectivity," Novellus Systems, Inc., U.S. Appl. No. 11/558,693, filed Nov. 10, 2006.

Dulkin et al., "Deposition of Thin Continuous PVD Seed Layers Having Improved Adhesion to the Barrier Layer," Novellus Systems, Inc., U.S. Appl. No. 11/473,618, filed Jun. 22, 2006.

Dulkin et al., "Method and Apparatus for Controlling Sputtered Flux in PVD Sources," Novellus Systems, Inc., U.S. Appl. No. 11/564,222, filed Nov. 28, 2006.

Kailasam et al., "Resputtering Process for Eliminating Dielectric Damage," Novellus Systems, Inc., U.S. Appl. No. 11/588,586, filed Oct. 26, 2006.

Lu et al., "An Integrated Plasma Equipment-feature Scale Model for Ionized Metal Physical Vapor Deposition", Jun. 2000, University of Illinois (16 pages).

Font et al., "Scaling of Hollow Cathode Magnetrons for Metal Deposition", Oct. 1999, University of Illinois (20 pages).

Rozbicki, R., "Methods and Apparatus for Resputtering Process that Improves Barrier Coverage," Novellus Systems, Inc., U.S. Appl. No. 11/830,777, filed Jul. 30, 2007.

Rozbicki et al., "Multistep Method of Depositing Metal Seed Layers," Novellus Systems, Inc., U.S. Appl. No. 11/701,984, filed Feb. 1, 2007.

Pradhan et al., "Atomic Layer Profiling of Diffusion Barrier and Metal See Layers," Novellus Systems, Inc., U.S. Appl. No. 11/807,179, filed May 24, 2007.

Juliano, D., "Selective Resputtering of Metal Seed Layers," Novellus Systems, Inc., U.S. Appl. No. 11/903,487, filed Sep. 21, 2007.

Vijayendran et al., "Gas Treatment Method and Apparatus to Improve Copper Gap Fill," U.S. Appl. No. 11/131,599, filed May 18, 2005.

Vyvoda et al., "Role of sidewall scattering in featuring profile evolution during $Cl_2$ and HBr plasma etching of silicon," J.Vac. Sci. Technol. B 18(2), Mar./Apr. 2000, pp. 820-833.

Hoekstra et al., "Microtenching resulting from specular reflection during chlorine etching of silicon," J.Vac. Sci. Technol. B 16(4), Jul./Aug. 1998, pp. 2102-2104.

Lane et al., "Feature evolution during plasma etching. II. Polycrystalline silicone etching," J.Vac. Sci. Technol. A 18(1), Jan./Feb. 2000, pp. 188-196.

Rozbicki R., "A Method of Enhancing Selectivity of Resputtering Process," Novellus Systems, Inc., U.S. Appl. No. 11/977,355, filed Oct. 23, 2007.

Pradhan et al., "Method and Apparatus for Increasing Local Plasma Density in Magnetically Confined Plasma," Novellus Systems, Inc., U.S. Appl. No. 11/807,182, filed May 24, 2007.

Kinder et al., "The Use of Ultra-High Magnetic Fields in Resputter and Plasma Etching," Novellus Systems, Inc., U.S. Appl. No. 11/807,183, filed May 24, 2007.

U.S. Office Action mailed on Mar. 6, 2009 for U.S. Appl. No. 11/903,487.

U.S. Office Action mailed on Feb. 23, 2009 for U.S. Appl. No. 11/701,984.

U.S. Office Action mailed on Mar. 24, 2009 for U.S. Appl. No. 11/473,618.

U.S. Office Action mailed on May 5, 2009 for U.S. Appl. No. 11/588,586.

Notice of Allowance and Fee Due mailed Jun. 17, 2009 for U.S. Appl. No. 11/888,323.

U.S. Final Office Action mailed Jun. 17, 2009 for U.S. Appl. No. 11/701,984.

U.S. Office Action mailed on May 26, 2009 for U.S. Appl. No. 11/564,222.

U.S. Office Action mailed Aug. 3, 2009 for U.S. Appl. No. 11/714,465.

Shaviv et al., "Conformal Films on Semiconductor Substrates" Novellus Systems, Inc., U.S. Appl. No. 12/467,200, filed May 15, 2009.

Notice of Allowance, mailed Sep. 18, 2009 for U.S. Appl. No. 11/903,487.

U.S. Office Action for U.S. Appl. No. 12/154,984, mailed Oct. 6, 2009.

D'Couto et al. J. Vac. Sci. Technol. B. 2001, 19(1), pp. 244-249.

U.S. Office Action mailed Jul. 23, 2009 for U.S. Appl. No. 12/122,118.

Notice of Allowance, mailed Nov. 9, 2009 and Allowed Claims for U.S. Appl. No. 11/701,984.

U.S. Final Office Action for U.S. Appl. No. 11/588,586 mailed Nov. 4, 2009.

Rozbicki et al., "Multistep Method of Depositing Metal Seed Layers" Novellus Systems, Inc., U.S. Appl. No. 12/699,738, filed Feb. 3, 2010.

U.S. Office Action mailed Feb. 4, 2010 for U.S. Appl. No. 11/807,179.

U.S. Office Action mailed Mar. 2, 2010 for U.S. Appl. No. 11/807,182.

U.S. Notice of Allowance and Allowed Claims, mailed Mar. 8, 2010 for U.S. Appl. No. 11/714,465.

U.S. Final Office Action mailed Mar. 11, 2010 for U.S. Appl. No. 12/122,118.

U.S. Final Office Action mailed Apr. 15, 2010 for U.S. Appl. No. 12/154,984.

U.S. Office Action mailed May 12, 2010 for U.S. Appl. No. 11/807,183.

* cited by examiner

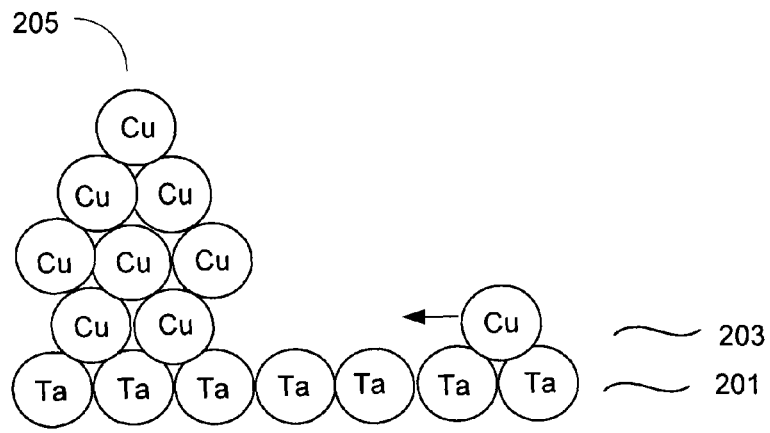
Figure 2A
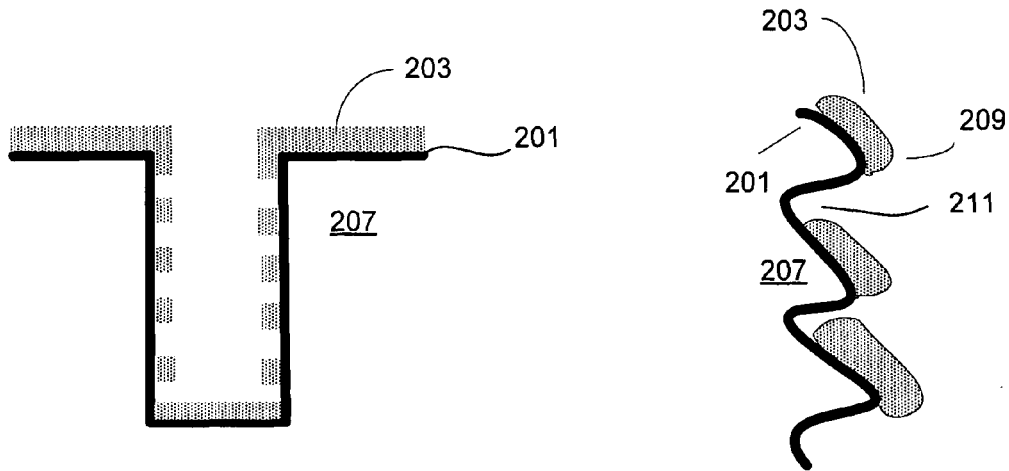
Figure 2B
Figure 2C
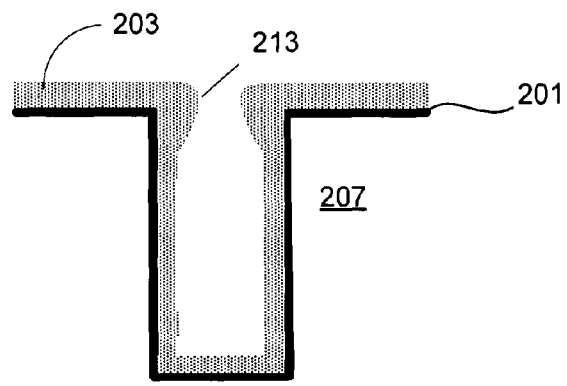
Figure 2D

METHODS AND APPARATUS FOR ENGINEERING AN INTERFACE BETWEEN A DIFFUSION BARRIER LAYER AND A SEED LAYER

CROSS-REFERENCE TO RELATED APPLICATIONS

This application is a continuation-in-part claiming priority under 35 USC 120 from U.S. patent application Ser. No. 11/473,618 filed Jun. 22, 2006 now U.S. Pat. No. 7,645,696, titled "Deposition of Thin Continuous PVD Seed Layers Having Improved Adhesion to the Barrier Layer", naming Dulkin et al. as inventors, which is herein incorporated by reference in its entirety for all purposes.

FIELD OF THE INVENTION

The present invention pertains to methods for forming a metal seed layer on a barrier layer of a partially fabricated integrated circuit.

BACKGROUND OF THE INVENTION

Damascene processing is a method for forming interconnections on integrated circuits that involves formation of inlaid metal lines in trenches and vias formed in a dielectric layer (inter-metal dielectric). The metal conductive lines are formed by an electroplating process. Because copper or other mobile conductive material provides the conductive paths of the integrated circuit, the underlying silicon devices must be protected from metal ions (e.g., $Cu^{2+}$) that might otherwise diffuse or drift into the silicon. Suitable materials for diffusion barrier include tantalum, tantalum nitride, tungsten, titanium tungsten, titanium nitride, tungsten nitride, and the like.

After diffusion barrier is deposited and prior to electroplating, a seed layer of copper or other metal is typically applied by a physical vapor deposition (PVD) process to enable subsequent electrofilling of the features with copper inlay. In order to serve as a seed for electroplating, the seed layer should be continuous, stable and have good adhesion to the barrier layer.

One difficulty with depositing seed layers is that the copper may agglomerate on the barrier layer surface. This phenomenon occurs because of the weak chemical bond between seed and the barrier as a result of the absence of an intermetallic reaction between the two. Because of this agglomeration, the copper may not cover the surface in a continuous manner, especially on the sidewalls of the recessed features. The thickness of the seed layer coverage is thus uneven, thicker in some places than others, and the layer may include gaps. Such seed layers do not provide a uniform layer for electroplating, which leads to voiding defects in the electroplated copper. Conventionally, in order to avoid discontinuity of seed layers, large amounts of seed layer material had to be deposited.

SUMMARY OF THE INVENTION

As the dimensions of features in integrated circuits (IC) scale down, non-conformal deposition of large amounts of seed layer material becomes less feasible. In narrow recessed features (e.g., in features having widths of about 65 nm and less, and particularly in features having widths of about 45 nm and less), deposition of large amounts of seed layer material can lead to formation of unacceptably large overhangs at the feature openings. The overhangs may partially or completely close the features to deposition of additional material, thereby leading to formation of voids during electroplating. Such voids affect the reliability characteristics of the formed devices. Therefore, it was herein recognized that methods for depositing thin and continuous seed layers are necessary, particularly for processing at a 45 nm technology node and at more advanced nodes. Methods for depositing conformal seed layers having improved adhesion to underlying barrier layers are herein provided. High stability and continuity of such layers leads to improved stress and electromigration resistance inside the vias and trenches in the formed devices.

As provided herein, copper seed layers are formed on diffusion barrier layers (e.g., on Ta, and $TaN_x$ layers) without significant agglomeration of copper, with the use of an engineered interface between a barrier layer and a seed layer. The engineered interface includes an adhesion layer, in which copper atoms are physically trapped and are prevented from migrating and agglomerating. The adhesion layer can include between about 20-80 atomic percent of copper. The copper atoms of the adhesion layer are exposed during deposition of copper seed layer and serve as the nucleation sites for the deposited copper atoms. Thin and conformal seed layers can be deposited on top of the adhesion layer without significant agglomeration. The trapping of copper within the adhesion layer is achieved by intermixing diffusion barrier and seed layer materials using physical vapor deposition (PVD) and/or atomic layer deposition (ALD).

One aspect of the invention pertains to a method of depositing a copper seed layer on a semiconductor substrate having a plurality of recessed features. The method includes (a) providing a semiconductor substrate having a barrier layer (e.g., Ta, $TaN_x$, or a Ta/$TaN_x$ bi-layer) deposited thereon; (b) forming an adhesion layer over at least a portion of the barrier layer; and (c) depositing the copper seed layer on at least a portion of the adhesion layer. The adhesion layer includes copper atoms intermixed with the diffusion barrier layer material, such that copper atoms are physically trapped by the diffusion barrier material, and a portion of copper atoms is exposed. The composition of the adhesion layer is different from the compositions of diffusion barrier and copper seed layers.

In one embodiment, the adhesion layer includes between about 20% and 80% of copper (referring to atomic %), preferably between about 35% and 65%, and even more preferably between about 40-60%. Copper is preferably evenly distributed throughout the exposed surface of the adhesion layer, without forming islands of copper-free diffusion barrier material. In one embodiment, the adhesion layer includes copper atoms intermixed with the diffusion barrier material substantially over an entire sidewall surface of a recessed feature. The thickness of the adhesion layer can range from about 2 to about 30 Å, preferably between about 5-10 Å.

Several methods may be used to form the adhesion layer. For example, resputtering in a PVD, an iALD or a plasma pre-clean chamber may be used to achieve intermixing between copper and diffusion barrier materials on the substrate surface. In one embodiment, the substrate is positioned in a plasma PVD chamber and the adhesion layer is formed by directing fluxes of diffusion barrier and seed layer materials to the substrate surface, in such a manner that intermixing of diffusion barrier and seed layer materials is achieved on this surface. The fluxes may be directed to the substrate surface sequentially or simultaneously. For example intermixing of materials on the sidewalls of recessed features can be achieved by directing a flux of tantalum from the tantalum sputter target to the substrate surface, followed by (or simultaneously with) a flux of copper directed from the bottom of the recessed feature to the same substrate surface, e.g., substrate sidewall.

In one embodiment, the adhesion layer is formed on a substrate having a barrier layer material residing at least on the bottom portions of the recessed features by (i) resputtering the barrier material from the bottom portions of the recessed features to expose an underlying copper surface in a dual damascene structure; (ii) resputtering the exposed copper from the bottom portions of the recesses onto the sidewalls of the recesses, thereby depositing copper atoms onto a layer of barrier material on the sidewalls; and (iii) depositing a thin layer of barrier material (e.g., from a sputter target) on at least the exposed copper surface. The thin layer of diffusion barrier physically traps copper atoms on the sidewall surface, without fully covering them, such that copper nucleation sites are exposed. If intermixing of diffusion barrier and seed layer materials needs to be further improved, one or more of the described operations are repeated at least once, e.g., the thin layer of diffusion barrier material is resputtered, followed by copper line resputter, and, optionally, by a diffusion barrier material deposition. Several cycles of deposition and resputter may be performed, wherein each deposition operation deposits less than about 50 Å of tantalum-containing material from the target and each resputtering operation resputters all of the deposited tantalum-containing material and between about 50-250 Å, preferably less than about 200 Å of copper.

In one embodiment forming the adhesion layer involves (i) resputtering a first portion of the barrier material from the bottom portions of the recessed features to expose an underlying copper surface; and (ii) resputtering the exposed copper from the bottom portions of the recessed features onto the sidewalls, such that a second portion of diffusion barrier material is being simultaneously deposited and sputter etched at the bottom of the recess with an etch rate to deposition rate (E/D) ratio of greater than about 1, wherein sputter etching of the second portion of diffusion barrier layer resputters diffusion barrier material onto the feature sidewall.

In another embodiment, a flux of copper may be directed from the sputter target to the substrate, followed by (or simultaneously with) a flux of tantalum or tantalum nitride directed from the bottom of the recessed feature to the feature sidewall. In one embodiment, the adhesion layer is formed on a substrate having a barrier layer material residing at least on the bottom portions of the recessed features by (i) depositing a thin layer of copper at least over the barrier material residing in the bottom portions of the recessed features; (ii) resputtering the deposited copper from the bottom portions of the recesses onto the sidewalls of the recesses, thereby depositing copper atoms onto the layer of barrier material on the sidewalls; and (iii) resputtering the barrier material residing at the bottom portions of the recesses onto the sidewalls of the recessed features, thereby intermixing the copper atoms with the barrier material on the sidewalls of the recessed features. If intermixing of diffusion barrier and seed layer materials needs to be further improved, one or more of the described operations are repeated at least once.

In one embodiment, the adhesion layer is formed on a substrate having a diffusion barrier deposited thereon by (i) depositing copper from the sputter target while simultaneously sputter etching the deposited copper with an etch rate to deposition rate (E/D) ratio at the bottom portions of the recessed features of greater than about 1, such that the etched copper atoms are resputtered onto the sidewalls of the recesses; and (ii) resputtering the barrier material residing at the bottom portions of the recessed features onto the sidewalls of the recessed features.

In one embodiment, which is particularly useful for a substrate having a layer of diffusion barrier deposited thereon by ALD, forming the adhesion layer includes resputtering the barrier material from the bottom portions of the recesses onto the sidewalls of the recesses while simultaneously depositing copper in a copper PVD chamber, thereby intermixing copper atoms and barrier material on the sidewalls of the recessed features. In one implementation of this embodiment, the net copper deposition rate is increased in the course of the resputtering process, thereby resulting in an interface having graded composition. The net copper deposition rate can be increased during resputter by, e.g., increasing the ratio between the DC power applied to the sputter target and the RF power applied to the wafer.

In some embodiments, the adhesion layer is formed using ALD. In one implementation, a nanolaminate of copper and tantalum sublayers is deposited resulting in an intermixing of copper and tantalum within a nanolaminate. One, several, or all of the layers in a nanolaminate may be deposited by ALD. In one embodiment, the adhesion layer includes alternating sublayers of tantalum-rich and copper-rich sublayers formed using ALD. Each sublayer in a nanolaminate is typically very thin, e.g., between about 2-6 Å, while the total thickness of the nanolaminate is less than about 20 Å. In some embodiments, the copper sub-layers in a nanolaminate are deposited by ALD, while the tantalum-containing sublayers are deposited using PVD.

Another aspect of this invention relates to a semiconductor device. In one embodiment, the device includes a layer of copper embedded in a layer of dielectric, a layer of diffusion barrier material residing between the layer of copper and the dielectric layer, and an adhesion layer residing between the diffusion barrier layer and the layer of copper. The adhesion layer includes copper intermixed with the diffusion barrier material and can have a copper concentration of about 20-80 atomic %. The adhesion layer, in one embodiment has a thickness of between about 2 and 15 Å.

Another aspect of this invention relates to an apparatus for processing material on a semiconductor wafer. In one embodiment, the apparatus includes a process chamber having an inlet for introduction of an inert gas, a wafer pedestal for holding the wafer in position during material processing, and a controller including program instructions for (a) receiving a substrate; (b) forming an adhesion layer on top of a layer of diffusion barrier residing on a substrate. In some embodiments, the apparatus further includes instructions for depositing a metal seed layer on top of the adhesion layer. In some embodiments, the apparatus is a copper PVD deposition chamber, a diffusion barrier deposition chamber, an ALD or an iALD deposition chamber, or a cluster tool which may include one or several PVD chambers and ALD chambers.

These and other features and advantages of the present invention will be described in more detail below with reference to the associated drawings.

BRIEF DESCRIPTION OF THE DRAWINGS

FIG. 2A presents a schematic illustration of copper agglomeration on a layer of tantalum.

FIG. 2B is a cross-sectional schematic view of a recessed feature having a discontinuous copper seed layer due to agglomeration of copper.

FIG. 2C illustrates a sidewall of a recessed feature showing microrelief of a PVD-deposited tantalum barrier layer.

FIG. 2D is a cross-sectional schematic view of a recessed feature having a copper seed layer deposited with overhang.

DETAILED DESCRIPTION OF PREFERRED EMBODIMENTS

Thin and continuous copper seed layers can be formed on top of tantalum-containing diffusion barrier layers when agglomeration of copper is prevented with the use of an engineered interface between the two layers. The engineered interface includes an adhesion layer in which copper atoms are physically trapped such that they cannot easily migrate and agglomerate. The trapped copper atoms serve as the nucleation sites for the subsequently deposited copper-containing material.

Copper seed layer materials as used herein include copper and its alloys, such as CuAl, CuZn, CuMg, CuSn, CuMn, CuAg, CuB, and the like. Tantalum-containing diffusion barrier materials include, but are not limited to Ta, $TaN_x$, $TaSi_xN_y$, $TaC_xN_y$, and combinations thereof. In general, provided methods are particularly suitable for engineering an interface between materials which do not have strong chemical affinity towards each other. For example, in the case of copper and tantalum, affinity of copper to copper (Cu—Cu bond strength) is much greater than affinity of copper to tantalum. Therefore, engineering of Ta/Cu interface is needed in order to prevent Cu—Cu agglomeration. While provided methods will be illustrated using tantalum and copper as example materials, it is understood that interfaces of other materials which do not have high chemical affinity towards each other may be similarly engineered. Examples of such interfaces which can be used in the seed/barrier context include, for example, $Cu/TiN_x$ and $Cu/WN_x$.

In order to frame the context of this invention, a brief description of a copper dual Damascene process for forming a partially fabricated integrated circuit is described below. The presented methods are not limited to a dual Damascene process and can be used in other processing methods, e.g., in single Damascene processing. While provided methods are particularly advantageous for processing substrates having narrow recessed features with widths of about 65 nm and less (e.g., about 45 nm), they can be equally applied to processing of substrates having wider recesses.

Figure 1A:
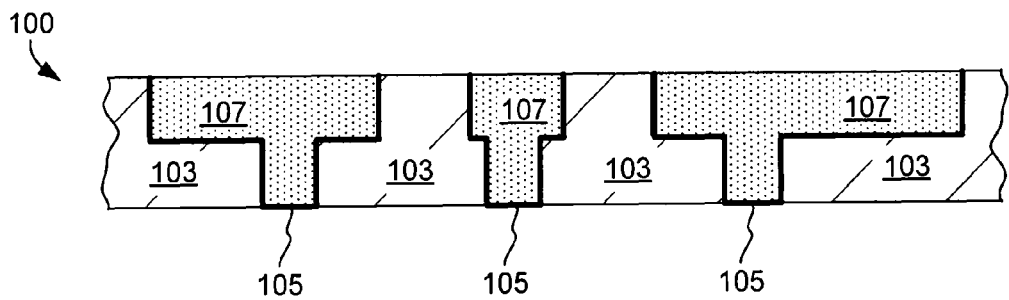
FIGS. 1A-1H show cross sectional depictions of device structures created during a copper dual Damascene fabrication process.

Presented in FIGS. 1A-1G, is a cross sectional depiction of device structures created at various stages of a dual Damascene fabrication process. A cross sectional depiction of a completed structure created by the dual Damascene process is shown in FIG. 1H. Referring to FIG. 1A, an example of a typical substrate, 100, used for dual Damascene fabrication is illustrated. Substrate 100 includes a pre-formed dielectric layer 103 (such as fluorine or carbon doped silicon dioxide or organic-containing low-k materials) with etched line paths (trenches and vias) in which a diffusion barrier 105 has been deposited followed by copper seed layer deposition and an inlay with copper conductive routes 107. Because copper or other mobile conductive material provides the conductive paths of the semiconductor wafer, the underlying silicon devices must be protected from metal ions (e.g., $Cu^{2+}$) that might otherwise diffuse or drift into the silicon. Suitable materials for diffusion barrier 105 include tantalum, tantalum nitride, and the like. In a typical process, barrier 105 is formed by a physical vapor deposition (PVD) process such as sputtering, a chemical vapor deposition (CVD) process, or an atomic layer deposition (ALD) process.

Typical metals for the conductive routes are aluminum and copper. More frequently, copper serves as the metal in Damascene processes, as depicted in these figures. The metal lines 107 are typically deposited by electrofill methods onto a thin layer of pre-deposited seed layer (not shown). The seed layer is usually deposited by PVD and can be formed, in some embodiments, using interface engineering methods described herein. Thus, for example, an adhesion layer can be deposited on top of diffusion barrier layer 105, prior to deposition of the seed layer. Thin and continuous seed layers are desired for a void-free electrodeposition of copper fill 107.

After fill of metal layer 107 (above the field) the excess metal is removed to the field level (as well as portions of diffusion barrier 105 on the field). This leaves metal inlay 107 exposed on the field region for construction of additional layers. The resultant partially fabricated integrated circuit 100 is a representative substrate for subsequent Damascene processing, as depicted in FIGS. 1B-1G.

Figure 1B:
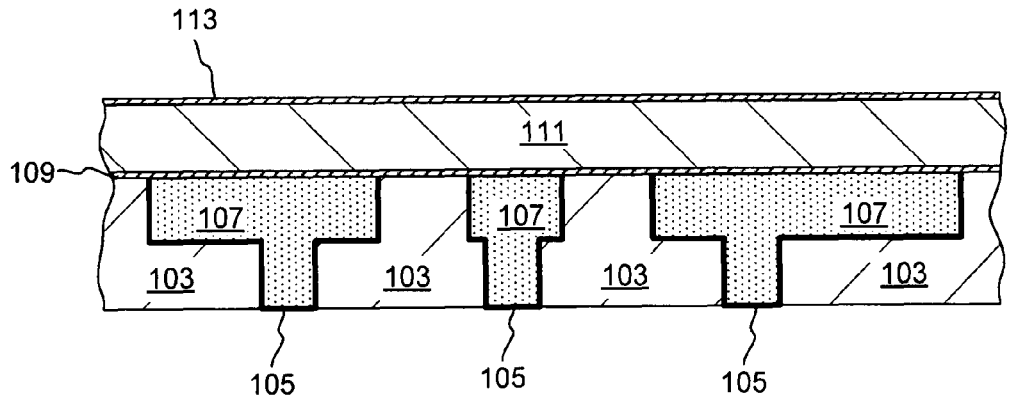

As depicted in FIG. 1B, a silicon nitride or silicon carbide diffusion barrier 109 is deposited to encapsulate conductive routes 107. Next, a first dielectric layer, 111, of a dual Damascene dielectric structure is deposited on diffusion barrier 109. The dielectric 111 is typically a low-k dielectric, such as described above for the layer 103. This is followed by deposition of an etch-stop layer 113 (typically composed of silicon nitride or silicon carbide) on the first dielectric layer 111. Layers 109, 111, and 113 can be deposited by CVD and plasma enhanced CVD (PECVD) methods from a variety of silicon, oxygen, carbon, and nitrogen containing precursors.

Figure 1C:
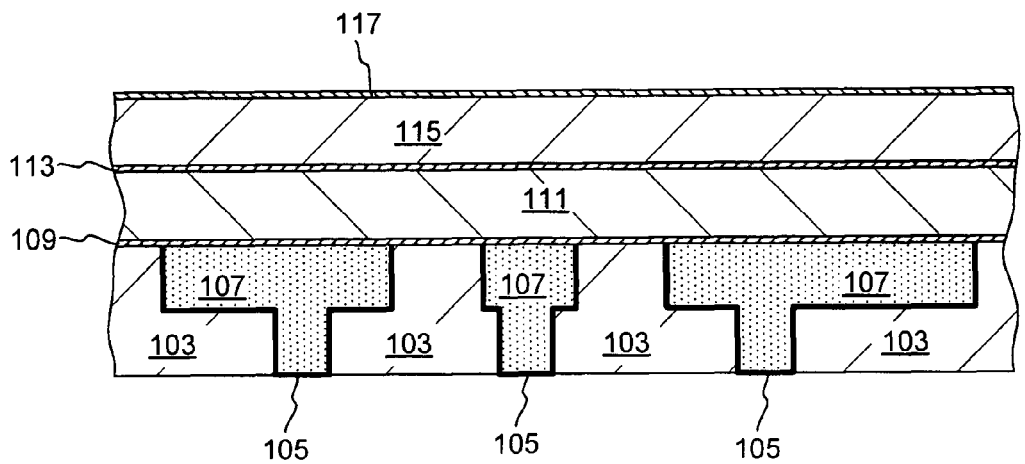

The process follows, as depicted in FIG. 1C, where a second dielectric layer 115 of the dual Damascene dielectric structure is deposited in a similar manner to the first dielectric layer 111, onto etch-stop layer 113. Deposition of an antireflective layer 117, typically containing BARC materials, follows.

Figure 1D:
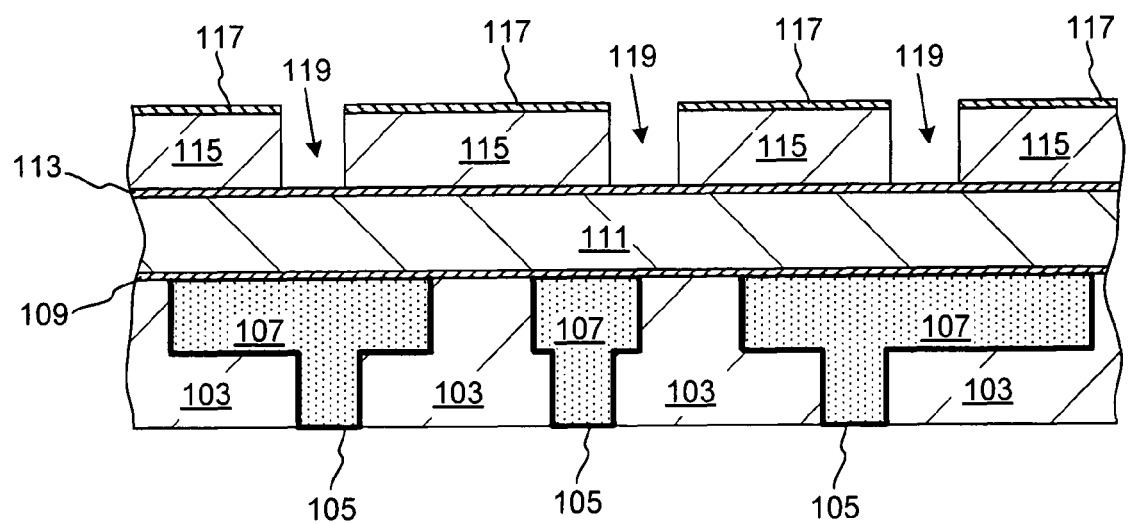
Figure 1E:
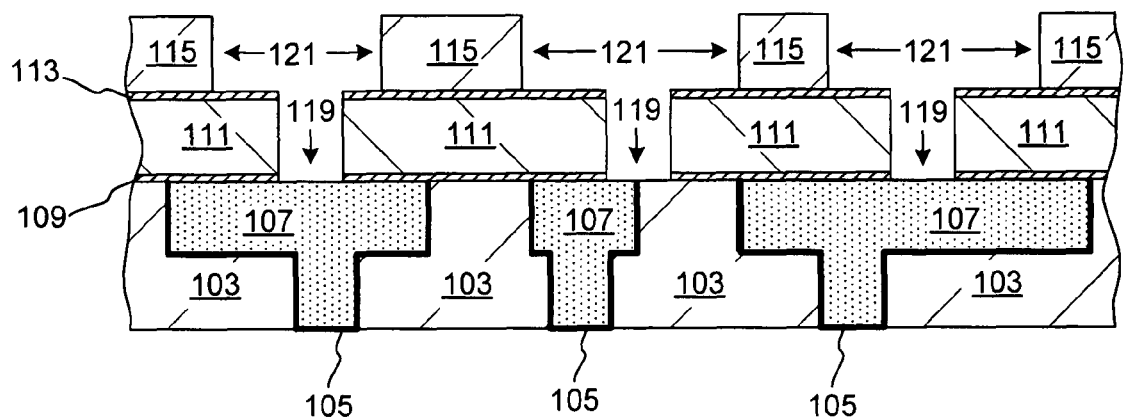

The dual Damascene process continues, as depicted in FIGS. 1D-1E, with etching of vias and trenches in the first and second dielectric layers. First, vias 119 are etched through antireflective layer 117 and the second dielectric layer 115. Standard lithography techniques are used to etch a pattern of these vias. The etching of vias 119 is controlled such that etch-stop layer 113 is not penetrated. As depicted in FIG. 1E, in a subsequent lithography process, antireflective layer 117 is removed and trenches 121 are etched in the second dielectric layer 115; vias 119 are propagated through etch-stop layer 113, first dielectric layer 111, and diffusion barrier 109.

Figure 1F:
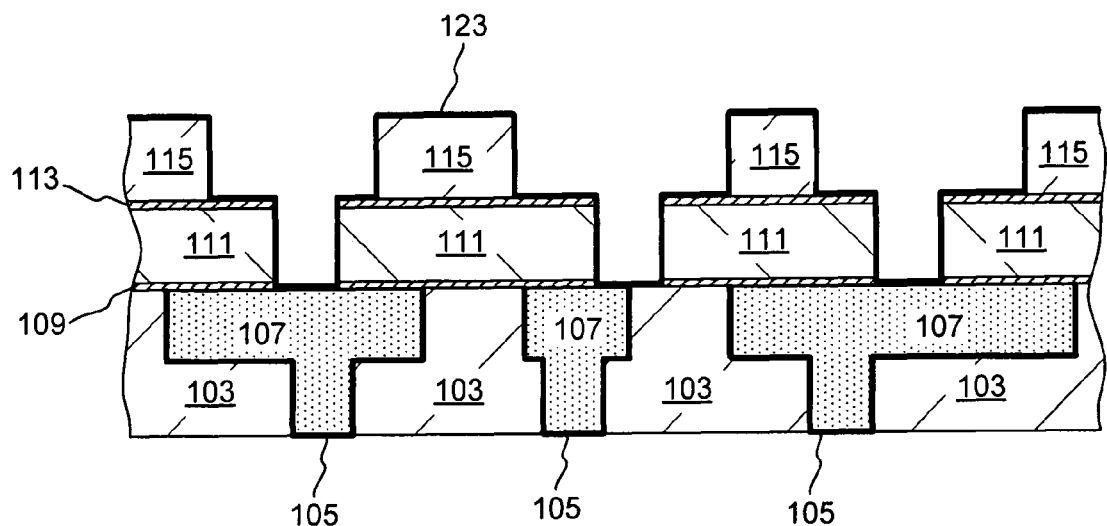

Next, as depicted in FIG. 1F, these newly formed vias and trenches are, as described above, coated with a diffusion barrier 123. The barrier 123 is made of tantalum, or other materials that effectively block diffusion of copper atoms into the dielectric layers. The methods provided herein can be integrated into deposition process flows for a diffusion barrier 123. Example deposition process flows that can make use of the methods provided herein are described in detail in U.S. Pat. No. 6,607,971, issued Aug. 19, 2003 naming Rozbicki et al as inventors, U.S. Pat. No. 6,764,940, issued Jul. 4, 2004 naming Rozbicki et al. as inventors, U.S. Pat. No. 7,186,648, issued Mar. 6, 2007 naming Rozbicki et al. as inventors, and in U.S. patent application Ser. No. 11/588,586, filed Oct. 26, 2006 naming Kailasam et al as inventors. U.S. Pat. Nos. 6,607,971, 6,764,940, 7,186,648, and the U.S. patent application Ser. No. 11/588,586 are herein incorporated by reference in their entireties and for all purposes.

An anchoring process that involves removing a portion of metal from underlying metal lines 107 in conjunction with barrier layer deposition is often performed to increase the reliability of formed interconnects. This process will be described in detail in the following sections.

According to methods presented herein, after the diffusion barrier 123 is deposited, an adhesion layer (not shown) is formed on at least some portions of layer 123 (e.g., on the sidewalls of the recessed features), and a seed layer of copper is applied (by a PVD, CVD or an ALD process) to enable subsequent electrofilling of the features.

Figure 1G:
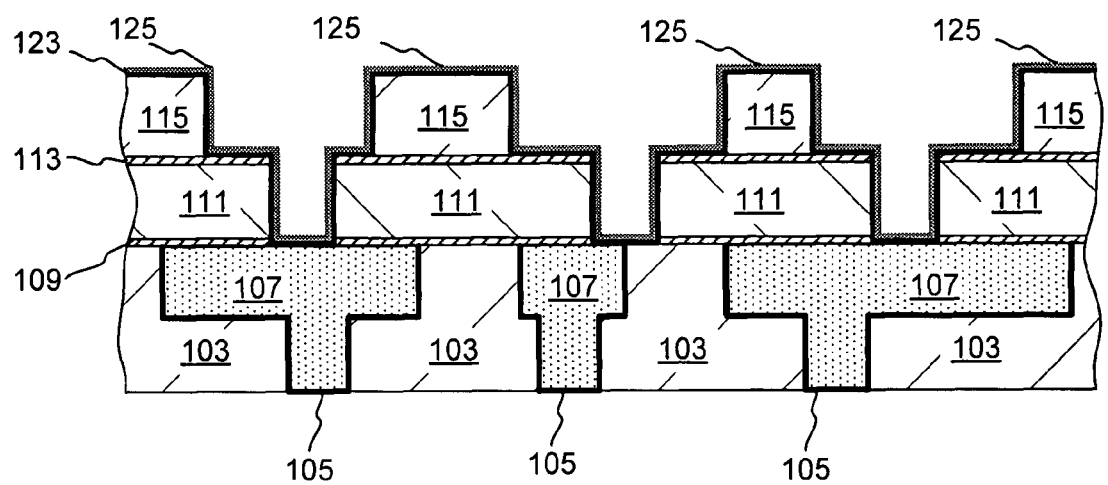
Figure 1H:
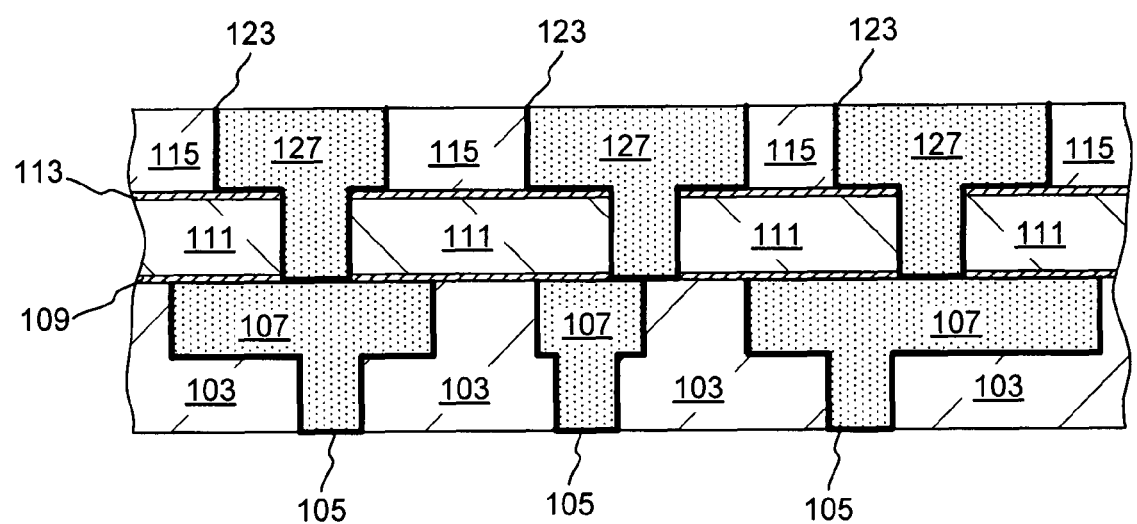

FIG. 1G depicts a copper seed layer 125 deposited on top of the diffusion barrier layer 123. The adhesion layer residing at the interface of layers 123 and 125 will be described in the following sections. The seed layer should preferably be conformal and should continuously coat the recessed features in order to support an electrofill process. Preferably, thickness of seed layer coverage should not significantly fluctuate depending on its position on the wafer. The surface engineering methods described herein can be integrated into deposition process flows for a seed layer 125. With the use of provided methods, recessed features having widths of about 60 nm can be coated with continuous seed layers having thicknesses of about 50 Å without substantial formation of overhang and with thickness variation over the recess sidewall of less than about 30%.

After the seed layer has been deposited, the recesses are electrofilled with copper. During electrodeposition of copper, the seed layer residing on the wafer serves as a cathode with an electrical contact being made at the edge of the wafer. To ensure electrical conduction, it is important that continuous, defect-free seed layers reside on a substrate. With non-continuous seed layers, as well as with continuous seed layers formed with large overhangs, electrodeposition of metal will typically proceed to form gaps within the deposited metal. Such gaps decrease the reliability of formed devices, as well as contribute to electromigration and stress migration.

After copper has been electrodeposited, excess copper is removed from the field by, for example, chemical mechanical polishing (CMP). FIG. 1H shows the completed dual Damascene structure, in which copper conductive routes 127 are inlayed (seed layer not depicted) into the via and trench surfaces over barrier 123.

Copper routes 127 and 107 are now in electrical contact and form conductive pathways, as they are separated only by diffusion barrier 123, which is also somewhat conductive.

The methods provided herein can be used for engineering the barrier/seed layer interface in a variety of structures. For example, barrier material 105 residing at the contact vias can be engineered with an adhesion layer. Barrier material 123 coating the landed and unlanded vias in the dual Damascene region can also be engineered as will be further described.

FIGS. 2A-2D illustrate problems associated with conventional deposition of copper seed layers on tantalum-containing barrier layers. As it was mentioned, copper and tantalum (as well as copper and tantalum nitride) do not have high affinity towards each other, and do not form intermetallic compounds or alloys under commonly used deposition conditions. Copper, however, has a good affinity towards itself, and preferentially forms self associated Cu—Cu clusters, rather than Cu—Ta structures. Weak bonding between copper and tantalum and stronger bonding between copper and copper leads to agglomeration of copper on a tantalum surface, which manifests itself in 3D, rather than 2D growth of copper layers. A schematic presentation of tantalum/copper interface illustrating such agglomeration is shown in FIG. 2A. When copper layer 203 is deposited on top of a tantalum surface 201, the deposited copper does not adhere well to the underlying tantalum, and prefers to migrate on the tantalum surface until it associates with other copper atoms. Agglomerated 3D copper structures 205 eventually form, leading to islands of copper residing on a tantalum surface. Therefore, the conventionally deposited copper seed layers suffer from non-conformal coverage, which manifests itself in patches of thick and thin seed layer. Further, when thin layers of copper seed are deposited on tantalum, the seed layer is often discontinuous having regions of uncoated tantalum and islands of agglomerated copper.

A discontinuous seed layer 203 is illustrated in FIG. 2B, which is a schematic cross-sectional view of a recessed feature (e.g., a via), residing in a layer of dielectric 207. The recessed feature is coated with a continuous layer of tantalum-containing diffusion barrier 201, on top of which a copper seed layer 203, has been deposited. The seed layer 203 is continuous on the horizontal surfaces of the structure, but is discontinuous on the sidewalls of the recessed feature. It is particularly challenging to obtain continuous coverage of feature sidewalls, since usually smaller amounts of seed layer material are deposited on the sidewalls compared to feature bottoms and field regions of a substrate. Agglomeration of copper on feature sidewalls leads to formation of uncoated gaps and copper islands on the sidewall surface, as illustrated in FIG. 2A.

In addition to copper agglomeration, a separate problem in seed layer deposition often arises when copper seed layers are deposited on top of PVD-deposited barrier layers. PVD-deposited diffusion barrier layers are usually not perfectly smooth and conformal and typically have a considerable degree of surface roughness. Therefore, deposition of thin copper seed layers on PVD-deposited surfaces, presents its own challenges. The microrelief of a PVD-deposited barrier layer exhibits protruding portions ("peaks") and microrecesses ("valleys") which are difficult to cover conformally with conventionally used techniques. A schematic view of a sidewall in a recessed feature being coated with a seed layer material is illustrated in FIG. 2C. The sidewall of a recessed feature residing in a layer of dielectric 207 is coated with a PVD-deposited diffusion barrier layer 201. The microrelief of the sidewall exhibits peaks 209 and valleys 211. When copper seed layer is deposited using PVD, copper is sputtered from the sputter target located above the recessed feature, resulting in increased deposition of copper on the protruding peaks 209, and little or no deposition in the valley regions 211, which are shadowed from the copper flux by the peak regions residing above them. It can be seen, that copper seed layer 203 is thus discontinuous on the sidewall. Agglomeration of copper further exacerbates the effect of surface roughness, resulting in further augmentation of microrelief, with large amounts of agglomerated copper residing on the peaks and little copper material in the shadowed regions. Therefore, layers with low conformality of coverage, and discontinuous layers are often obtained. After copper electrofill is performed on such discontinuous seed layers, the resulting structure will have microvoids, which increase via resistance and contribute to electromigration and stress migration failures.

Agglomeration of copper has been conventionally mitigated by depositing copper seed layers at lower temperatures. Further, formation of discontinuous layers has been conventionally avoided by depositing larger amounts of copper seed materials, such that at least some of the deposited copper would bridge the islands of agglomerated copper. However, both methods have their drawbacks. In particular, deposition of large amounts of copper to produce continuous coverage becomes less feasible as the dimensions of recessed features are being scaled down. When large amounts of copper are deposited to achieve minimal coverage on the recess sidewall, large overhangs 213 are often formed at the recess opening, as illustrated in FIG. 2D. For narrow features having widths of about 65 nm, and less (e.g., about 45 nm), overhang formation may essentially close the feature for subsequent deposition of material. Deposition of both discontinuous seed layers as depicted in FIG. 2B, and continuous seed layers with overhangs, as depicted in FIG. 2C, results in formation of voids during subsequent electrofill operations, and, consequently leads to decreased reliability of formed IC devices. Therefore, methods for depositing thin and continuous seed layers are needed.

Figure 3:
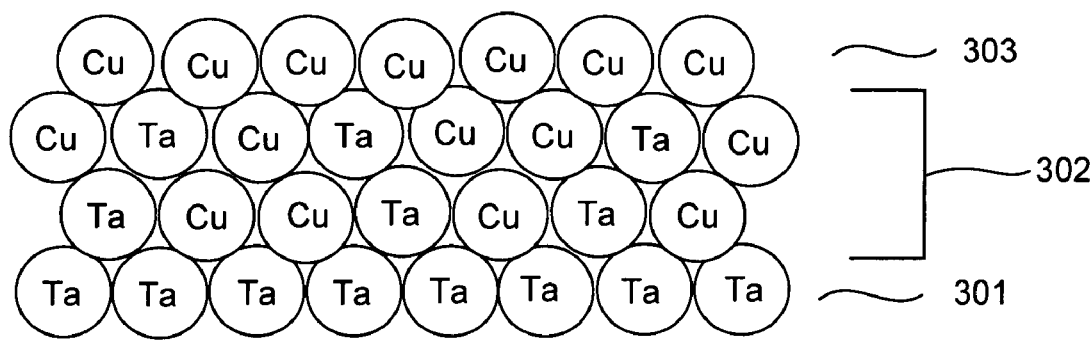
FIG. 3 is a schematic representation of an example diffusion barrier/copper seed interface in accordance with an embodiment presented herein. An adhesion layer is illustrated.

It was discovered that agglomeration of copper can be significantly decreased by engineering the Cu/Ta interface to include an adhesion layer in which copper atoms are physically trapped and are prevented from migrating. An example of such interface is illustrated in FIG. 3. The structure shown in FIG. 3 includes a tantalum diffusion barrier layer 301 (illustrated by one atomic monolayer), an adhesion layer 302 residing upon it, and a copper seed layer 303 (also illustrated by one atomic monolayer) located on top of the adhesion layer 302. The adhesion layer includes copper atoms intermixed with tantalum atoms, such that they cannot freely migrate and are therefore physically trapped within the adhesion layer. The adhesion layer is engineered such that its portion contacting the copper seed layer 303 includes copper atoms, which are preferably uniformly distributed over the length of the adhesion layer 302. Since copper has a good affinity towards itself, the copper atoms residing at the top of the adhesion layer will serve as adhesion sites for the deposited copper atoms of layer 303, thereby promoting 2D growth of the copper layer. The deposited copper atoms of the seed layer 303, therefore, will not migrate as freely as they migrate on a tantalum surface, but would rather associate with the exposed copper atoms of the adhesion layer. As a result, thin and conformal copper films would be deposited on the engineered surfaces. For example continuous copper seed layers having thicknesses of about 30-80 Å, e.g., less than about 100 Å can be deposited. Thickness variation in such layers, in one embodiment, does not exceed about 30%.

The structure presented in FIG. 3 is a simplified schematic illustration, and does not intend to accurately represent the crystal lattice at the Cu/Ta interface. The adhesion layer 302 shown in FIG. 3 includes two atomic monolayers of intermixed copper and tantalum. In general, the adhesion layer may have a thickness of at least one atomic monolayer. For example, the adhesion layer can have a thickness of between about 2 Å and 30 Å, more preferably between about 2 Å and 15 Å. The adhesion layer, in one embodiment, includes a physical mixture of diffusion barrier material (e.g., Ta and $TaN_x$) and copper. Copper concentration in the adhesion layer may range, e.g., between about 20-80% atomic, preferably between about 35-65%, and even more preferably between about 40-60%. In some embodiments, the adhesion layer can have a graded composition, e.g., with copper concentration gradually increasing from the tantalum interface to the copper interface. In other embodiments, the adhesion layer may include a nanolaminate, which will include tantalum-rich and copper-rich sublayers, with each sub-layer having a thickness of about 2-8 Å, preferably less than about 5 Å. Copper-rich sublayers having at least about 50% of copper, preferably at least about 80% of copper and tantalum-rich sublayers having at least about 50% of tantalum, preferably at least about 80% of tantalum may alternate forming a stack of between about 2-10, preferably between about 2-6 sublayers. The sublayers preferably interweave with each other resulting in intermixing of tantalum-containing material and copper. The thickness of such nanolaminate according to some embodiments is less than about 20 Å.

Regardless of a particular microstructure within the adhesion layer, it is important that it is engineered such that exposed copper atoms are provided as nucleation sites for the oncoming deposited copper seed material. The surface of an adhesion layer prior to deposition of seed layer preferably contains at least about 20%, preferably at least about 40% of copper. The exposed copper is preferably distributed uniformly over the length of the adhesion layer. While the surface may contain copper-rich surface regions, it is preferable that the surface of the adhesion layer does not contain long copper-free stretches. Preferably, adhesion layer surface prior to deposition of seed layer may contain copper-free stretches of only less than about 50 Å, preferably of less than about 20 Å, and more preferably of less than about 10 Å.

It is noted that copper and tantalum atoms within the adhesion layer are physically intermixed without substantial chemical bonding between the two. Since chemical bonding does not need to be present between the materials constituting the adhesion layer, in some embodiments the adhesion layer does not include materials that would form intermetallic compounds or alloys with each other. For example, the adhesion layer may include physical mixtures of copper with Ta, $TaN_x$, $TiN_x$ or other materials that do not form alloys with copper.

While it is preferable in some embodiments that the adhesion layer contains the same diffusion barrier material on which it resides (e.g., as in a Ta/Ta,Cu/Cu structure) it is not required, and in other embodiments, the adhesion layer may include a different diffusion barrier material than the one on which it resides. Examples of such structures include Ta/TaN$_x$,Cu/Cu; Ta/TaN$_x$,Ta,Cu/Cu; and Ta/TiN$_x$,Cu/Cu, wherein the interfaces are described in the diffusion barrier/adhesion layer/seed layer format.

Figure 4:
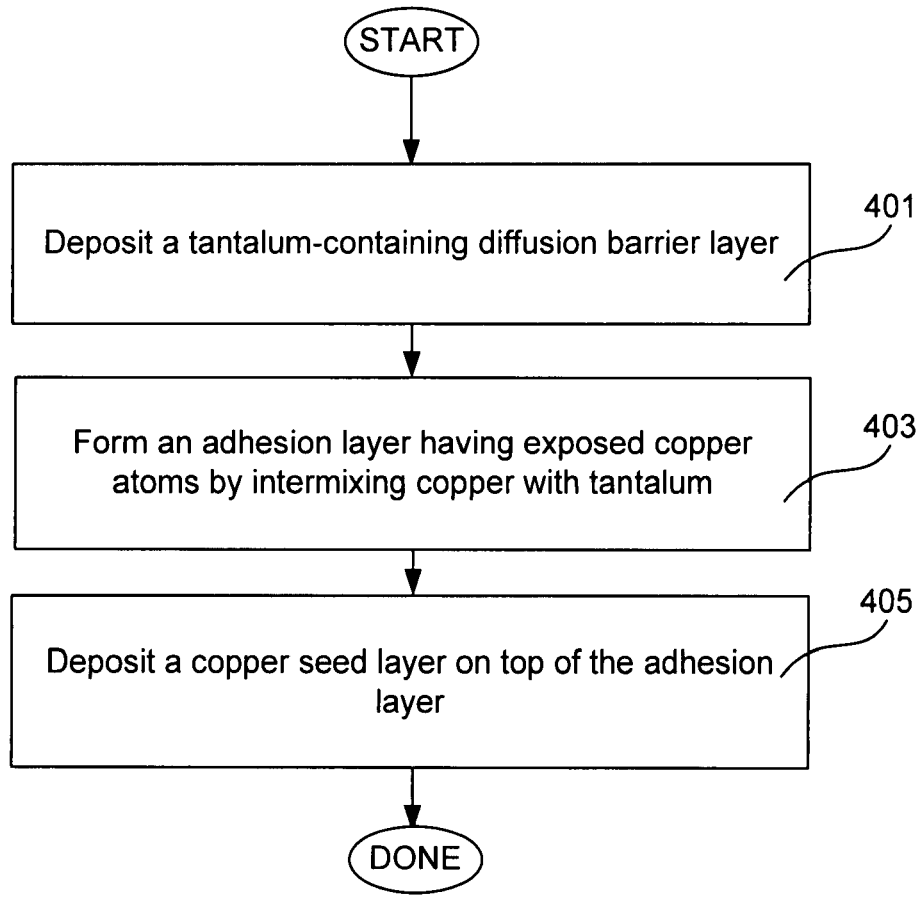
FIG. 4 is an example process flow diagram for a seed layer deposition process in accordance with an embodiment described herein.

A process flow diagram for a method of depositing a copper seed layer on an engineered surface is illustrated in FIG. 4. FIGS. 5A-5E show cross-sectional depictions of device structures fabricated during the process shown in FIG. 4.

Figure 5A:
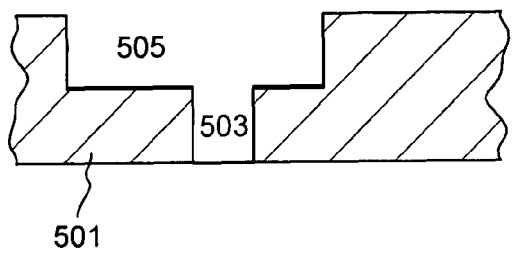
FIGS. 5A-5E present cross-sectional depiction of device structures obtained in a process according to an embodiment described herein.
Figure 5B:
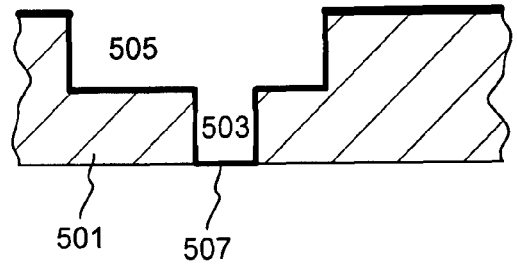

The process starts by operation 401 in which a tantalum-containing diffusion barrier layer is deposited on a substrate. The substrate typically contains a plurality of recessed features, such as vias and trenches formed in a layer of dielectric. The tantalum-containing diffusion barrier material may include, e.g., Ta, TaN$_x$, TaSiN$_x$, TaCN$_x$ and mixtures thereof. In one embodiment, the tantalum-containing diffusion barrier layer is a TaN$_x$/Ta bi-layer, in which TaN$_x$ is deposited adjacent the dielectric, and a layer of Ta resides on a layer of TaN$_x$. The diffusion barrier material can be deposited by a number of methods, including PVD (such as iPVD), ALD (including iALD), chemical vapor deposition (CVD) and pulsed deposition layer (PDL). For example Ta and TaN$_x$ can be deposited both by PVD and ALD, while TaSiN$_x$, and TaCN$_x$ can be deposited using CVD and ALD. FIG. 5A shows a cross sectional depiction of a substrate, having a via 503 and a trench 505 formed in a layer of dielectric 501. After diffusion barrier material has been deposited, a structure shown in FIG. 5B is formed, in which the diffusion barrier layer is coating the substrate.

After the layer of diffusion barrier material has been deposited, an adhesion layer is formed on top of it in an operation 403. As described above, the adhesion layer includes copper which is physically intermixed with the diffusion barrier material, such that copper atoms are trapped, but are also exposed on an adhesion layer surface. Several methods can be used to achieve such intermixing. According to some embodiments, intermixing can be achieved in a PVD chamber with the use of specially designed resputtering operations. Resputtering refers to redistribution of material on a substrate surface, in which material is removed from one surface on the substrate and is redeposited on a different surface. For example, diffusion barrier material can be resputtered from a via bottom to a via sidewall when ions formed in a plasma impinge on the bottom of the via with a sufficient momentum to dislodge material from the via bottom. While resputtering in a PVD process chamber will be primarily described, provided methods can employ resputtering in other types of apparatus which are capable of generating plasma. In some embodiments, resputtering in a plasma pre-clean chamber, in an iALD chamber, or in a plasma-enhanced ALD chamber may be performed.

In other embodiments, intermixing is achieved in an ALD process chamber by depositing a nanolaminate of copper-rich and tantalum-rich sublayers. Yet in other embodiments, adhesion layer may be formed using both ALD deposition and PVD resputtering operations.

Figure 5C:
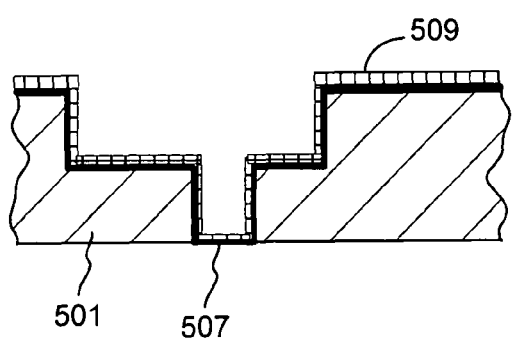

FIG. 5C illustrates a device structure having an adhesion layer 509 formed on top of the diffusion barrier layer 507. The adhesion layer does not necessarily need to coat all of the diffusion barrier surfaces as shown in FIG. 5C. For example, in some embodiments, the adhesion layer is formed only on the sidewalls of the recessed features, while its deposition on horizontal surfaces (e.g., on the field regions and on recess bottoms) may not be necessary.

Figure 5D:
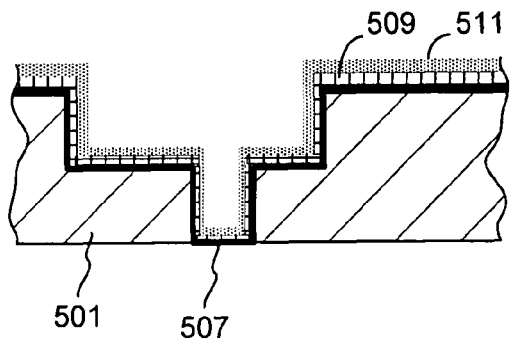
Figure 5E:
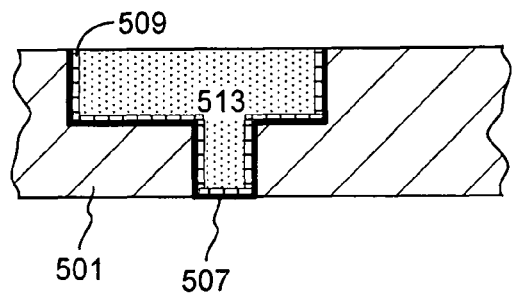

After the adhesion layer has been formed, the process follows by depositing a copper seed layer on top of the adhesion layer in an operation 405. The copper seed layer can be deposited, for example, in a PVD process chamber or an ALD process chamber. Copper-containing alloys can be similarly deposited. The resulting device structure is shown in FIG. 5D, in which a thin conformal copper seed layer 511 resides on top of the adhesion layer 509. The bulk of copper is then deposited, e.g. using an electrofill operation, and remaining copper overburden and diffusion barrier material is removed from the field regions using CMP, resulting in a structure shown in FIG. 5E. The device shown in FIG. 5E, has a layer of copper 513 filling the via and the trench embedded in a layer of dielectric 501, a layer of diffusion barrier material 507 residing between the layer of copper and the dielectric layer, and an adhesion layer 509 residing between the diffusion barrier layer and the layer of copper.

Figure 6:
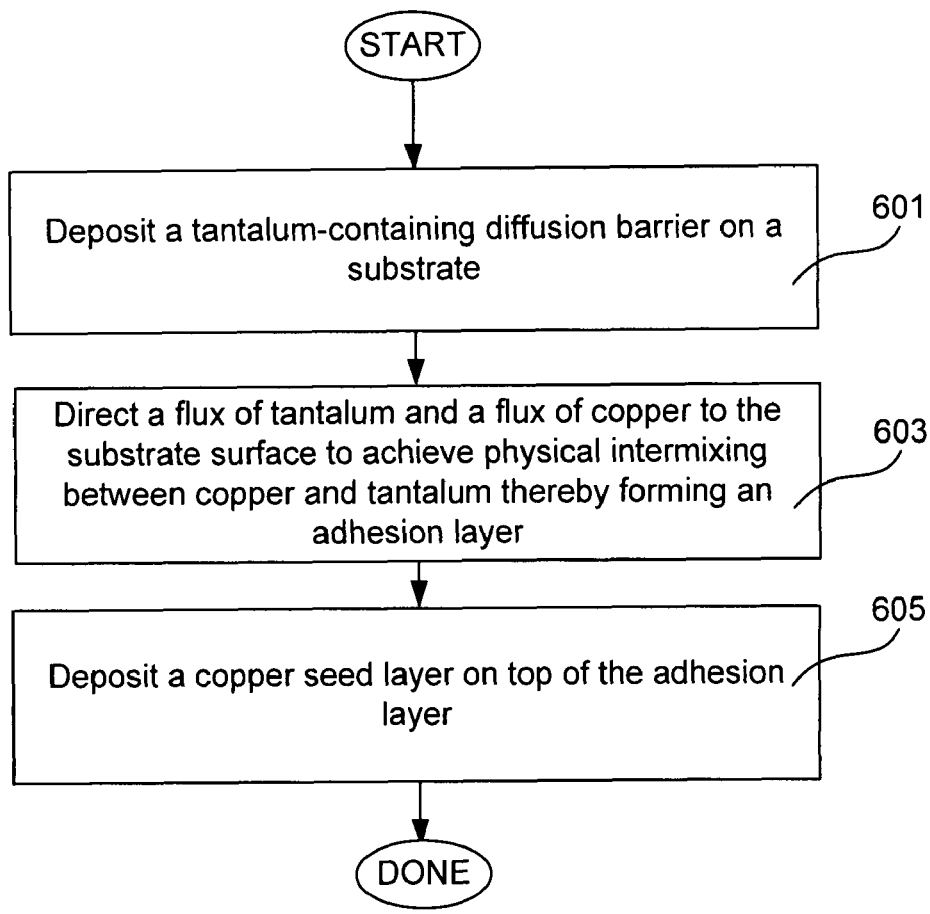
FIG. 6 is an example process flow diagram for a seed layer deposition process in accordance with an embodiment described herein.

Referring again to methods of engineering the Cu/Ta interface, in one implementation, the adhesion layer is formed by providing a flux of copper-containing material and a flux of tantalum-containing material, such that these materials are intermixed on the substrate surface, e.g., on a sidewall of a recessed feature. FIG. 6 illustrates a process flow diagram, according to this embodiment. The tantalum-containing diffusion barrier material is deposited on a substrate in an operation 601. The process follows in 603 by directing a flux of copper-containing material and a flux of tantalum-containing material to achieve physical intermixing between the two materials on the diffusion barrier surface. Fluxes of these materials can originate from sputter targets in PVD process chambers and from resputter fluxes, originating from material residing on the substrate and undergoing resputter. In a typical PVD process, a flux of material is generated by sputtering material from a target, which is typically made of the same material that needs to be deposited. In the PVD system inert gas ions formed in the plasma impinge on a metal target, dislodging metal from the target and depositing it on a substrate. For example tantalum can be deposited by bombarding a tantalum target with inert gas ions in a tantalum deposition chamber, and copper, similarly, can be sputtered from a copper target in a copper deposition chamber. TaN$_x$ can be deposited by sputtering tantalum from a tantalum target using a nitrogen-containing process gas.

Since tantalum and copper are deposited in different process chambers, each having its own metal target, directing fluxes of tantalum and copper to achieve intermixing of materials in an adhesion layer, may be difficult without transferring the substrate between the chambers several times. Alternatively, two targets may be positioned within the process chamber to provide simultaneous or sequential fluxes of copper and tantalum that would achieve desired intermixing. While the methods mentioned above, which involve depositing small amounts of copper and tantalum in different chambers, and depositing a mixture of copper and tantalum in a chamber having two targets or a specially engineered target, are within the scope of present invention, they are expensive and time-consuming. It was discovered that using at least one flux generated from the substrate by resputter and one flux generated from the sputter target can achieve efficient intermixing of materials in an adhesion layer, without the need for a specially engineered hardware. Resputter and target-generated fluxes can be directed to the substrate either simultaneously or sequentially by modulating PVD process parameters, and can be used to form an adhesion layer both in a copper PVD and in a tantalum PVD process chambers.

Figure 7A:
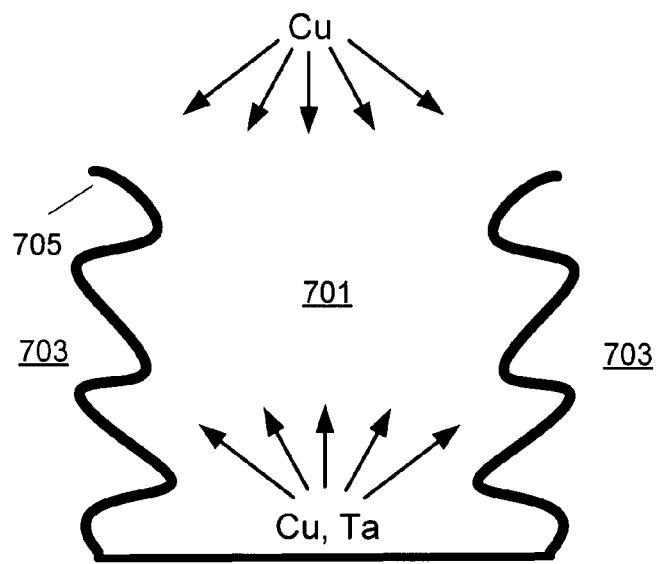
FIGS. 7A and 7B present schematic illustrations of device structures undergoing deposition of an adhesion layer in a copper deposition module (FIG. 7A) and in a tantalum deposition module (FIG. 7B).
Figure 7B:
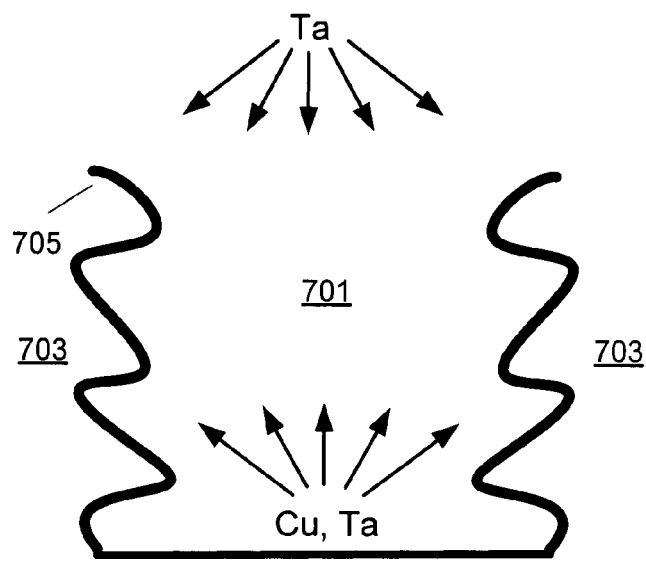

Further, it was recognized that applying fluxes of materials from opposite directions achieves particularly good coverage and improved intermixing of materials on PVD-deposited diffusion barrier layers which are typically characterized by significant surface roughness. The target-generated flux is directed to the substrate surface from above, while the resputter-generated flux is typically directed from below, e.g., from feature bottoms onto the feature sidewalls. The two fluxes will achieve improved coverage on a sidewall having a pronounced microrelief characterized by peaks and valleys because the fluxes complement each other by depositing material on the otherwise overshadowed portions of sidewalls. FIGS. 7A and 7B are schematic illustrations of recessed features 701 formed in a dielectric 703. A barrier layer 705 having significant surface roughness resides on the feature sidewalls. The figures are not drawn to scale and show exaggerated sidewall microrelief for illustration purposes. FIG. 7A illustrates formation of an adhesion layer in a copper deposition chamber (PVD chamber equipped with a copper target). In the illustrated example, the copper flux is directed from the target onto the recessed feature. The resputter flux which may include both copper and tantalum is directed from the bottom of the recessed feature. FIG. 7B illustrates formation of an adhesion layer in a tantalum deposition chamber (PVD chamber equipped with a tantalum target). Tantalum flux is directed from the target onto the recessed feature. The resputter flux which may include both copper and tantalum is directed from the bottom of the recessed feature.

The target flux and the resputter flux may be applied either simultaneously or sequentially, as will be further described. A number of implementations that make use of these fluxes for engineering the Cu/Ta interface can be practiced. Note that these implementations will use special sets of conditions to achieve efficient intermixing of copper and tantalum within the adhesion layer as well as to achieve exposure of trapped copper atoms on the surface of the adhesion layer. Therefore, provided methods are significantly different from previously used deposition/resputter sequences which were used for redistribution of materials on a wafer. For example, in some embodiments provided herein, very thin layers of materials (e.g., less than about 50 Å thick, such as less than about 20 Å thick) are being repeatedly deposited and resputtered to achieve good intermixing of tantalum and copper.

Several specific implementations of provided methods will be now described. In order to frame the context of these implementations, a brief overview of PVD and resputter will be now provided.

During deposition in a plasma PVD apparatus, in one implementation, the wafer substrate is placed into the process chamber, which is configured for plasma generation. The process chamber includes a metal target which accepts a negative DC bias and serves as a source of metal flux during deposition, a wafer pedestal which holds the wafer in position during material processing and also provides temperature control of the wafer, an inlet for introduction of an inert gas, and one or several magnets for confining the plasma in the proximity of the target. A negative RF bias can be optionally applied to the wafer. When net deposition of material is desired, typically no bias or a small negative bias is applied to the wafer. After the wafer substrate is secured on the wafer pedestal, and the inert gas (e.g., argon) is introduced into the chamber, the plasma is ignited by applying a DC power to the target and confining the plasma with the use of magnetic field in the proximity of the target. Argon is positively ionized in a plasma to form $Ar^+$ ions which impinges on a negatively charged target with a sufficient momentum to dislodge metal atoms from the target. The neutral metal atoms dislodged from the target can be further ionized in the plasma. The metal species including neutral and ionized metal are being sputtered from the target onto the wafer and deposited on its surface.

When negative bias is applied to the wafer, the argon ions and metal ions may acquire sufficient energy at the wafer surface to impinge upon the wafer with a sufficient momentum to dislodge material from the wafer surface causing etching (resputter). Atoms of the etched material may be permanently removed from the wafer, or may be redistributed from one position on the wafer to a different position. For example, material may be redistributed from the bottom of the via to the via sidewalls. Typically, etching and depositing processes are occurring simultaneously in the PVD chamber. Etching results from the inert gas ions and, in some cases, by metal ions, impinging on the wafer with a sufficient momentum to dislodge the exposed material, while deposition results from the neutral metal atoms and, in some cases, by metal ions, being sputtered onto the wafer from the target. When an intrinsic etch rate E is greater than the intrinsic deposition rate D, a net etching process is occurring on the wafer surface. When the etch rate E is smaller than the deposition rate D, the process is characterized as a net deposition.

An etch rate to deposition rate ratio is often used to characterize the resputtering and deposition processes. At the E/D ratio of 1, no net deposition or etching is occurring. At the E/D ratio of 0, the process is entirely depositing. At E/D ratios of greater than 1 etching predominates, this being characteristic of resputter. The E/D ratio is not necessarily the same in different features of the wafer. For example, the E/D ratio in the field, in the trench, and in the via may have different values. For example, it is possible to have net deposition in the field region (E/D<1) and net etch at the via bottom (E/D>1). The resputtering process can be described as a process that provides an E/D>1 at least at one location on the wafer, e.g., at a via bottom, at the lowest lying feature on the wafer or in some cases in the feature having the highest aspect ratio. The fact that a net deposition is occurring at a different location on the wafer, e.g., in the field, does not change the fact that resputtering is performed. An E/D ratio can be modulated by modulating the process parameters, such as the DC power applied to the target and the RF power applied to the wafer. The intrinsic deposition rate D is typically increased as the DC power to the target increases, because larger amounts of metal species are being sputtered from the target. An intrinsic etch rate E is typically increased as the RF power at the wafer increases, since it results in higher energy of inert gas ions and/or metal ions impinging on the wafer. Therefore E/D ratio can be increased by increasing the RF(wafer)/DC(target) power ratio.

As described net etching and net deposition can be performed in one process chamber and can be controlled by process parameters such as power levels applied to the wafer and the target, pressure in the process chamber, strength of magnetic fields, etc.

For the etchback (resputter) step the combination of DC power applied to the target and RF power applied to the wafer has to ensure the net material removal from the wafer. For example, for HCM modules having target areas of between about 1000-6000 $cm^2$, DC power should be in the range from 1 kW to 10 kW or as low as 0 for the pure etching. One of skill in the art will understand that this range depends on the target area, and can be different for smaller or bigger targets especially if the method is used with the different source/target design. The RF power may be between about 100 W to 3000 W for a typical substrate (e.g., a 300 mm wafer). This range depends on the wafer area and can be much greater for applications that deal with big substrates. In terms of power density (independent of the target area or substrate area), examples of suitable DC power ranges for the sputter etch operation are range from about 0 W/(cm² target) to 5 W/(cm² target) and for the RF power, from about 0.1 W/(cm² substrate) to 5 W/(cm² substrate).

For the net deposition process the DC power can range from about 5 W/(cm² target) to 25 W/(cm² target), and, for the RF power, from about 0 W/(cm² substrate) to 0.5 W/(cm² substrate). PVD deposition is described in U.S. Pat. Nos. 6,905,959; 6,773,571; and 6,642,146, which patents are hereby incorporated by reference and for all purposes.

In certain embodiments, it is desirable for the inert gas sputter flux to be accompanied by a small deposition flux. In typical HCM operation mode the pedestal capacitive RF discharge feeds on electrons created by the source at relatively low DC power (e.g., 0.1 W/(cm² target)-5 W/(cm² target)). Thus, the strong flux of argon or other inert gas ions to the wafer is accompanied by the small flux of copper (or other metal) species to the wafer.

Advantageously deposition and resputter can be integrated in one chamber for a process of forming an adhesion layer. Deposition and resputter can be performed sequentially or simultaneously, as will be illustrated.

Figure 8:
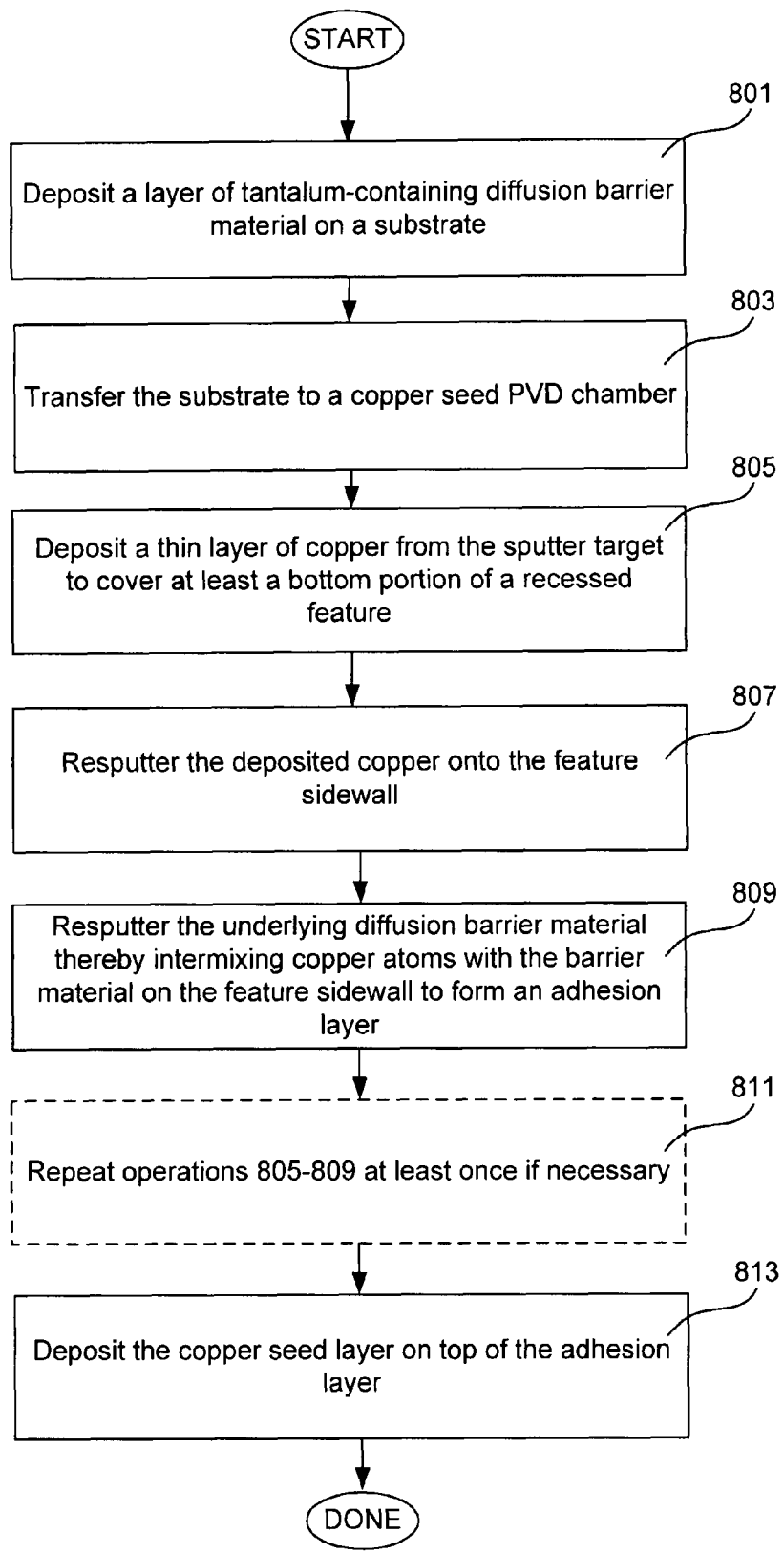
FIG. 8 presents an example process flow diagram for deposition of a copper seed layer according to an embodiment described herein. Deposition of adhesion layer in a copper deposition model is illustrated.
Figure 9A:
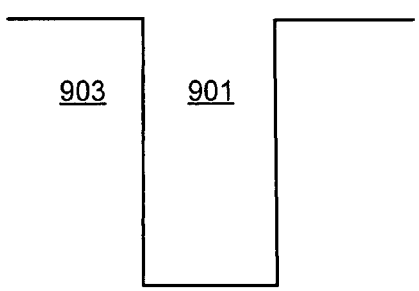
FIGS. 9A-9F present cross-sectional device structures obtained during deposition of a seed layer material according to a method described herein.
Figure 9B:
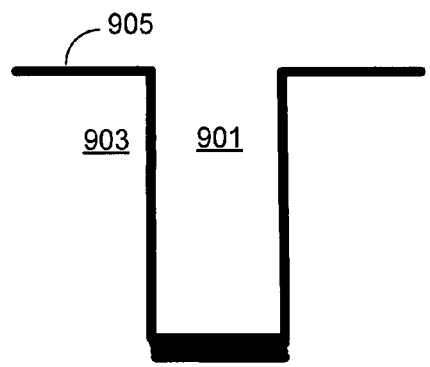

One embodiment, which involves forming the adhesion layer in a copper seed deposition chamber is illustrated by the process flow diagram shown in FIG. 8. The device structures obtained during fabrication process are shown in FIGS. 9A-9F. The process starts by operation 801, which deposits a tantalum-containing diffusion barrier layer on a substrate. As described above, the diffusion barrier layer may be deposited, for example, using PVD, ALD, CVD, and PDL. For example a $TaN_x$/Ta bi-layer may be deposited in a PVD chamber equipped with a tantalum target using following process conditions. In an example process, the 300 mm wafer is placed into the tantalum deposition chamber of an HCM. Argon and nitrogen are introduced into the process chamber at flow rates of between about 10-100 sccm each and at a ratio of about 0.5-5. Plasma is formed by applying a negative DC bias to the target at a power level of between about 15 and 30 kW. RF bias at a power level of about 200-1200 W is applied to the wafer and the chamber pressure is maintained in the range of about 0.5-3 mTorr. A layer of $TaN_x$ is deposited to a thickness of about 10-50 Å on the sidewall and to about 30-100 Å at the bottom of a recessed feature. Nitrogen is then removed from the process chamber using a pump and a layer of tantalum is deposited under similar conditions but without the use of nitrogen. A layer of Ta is deposited on a layer of $TaN_x$ to a thickness of between about 10-50 Å on a sidewall and to a thickness of between about 30-100 Å on the feature bottom. If better sidewall coverage is desired a portion of deposited barrier material can be optionally resputtered from the recess bottom to the recess sidewall. FIG. 9A illustrates a substrate having a recessed feature 901 formed in a layer of dielectric 903. FIG. 9B illustrates the substrate after the diffusion barrier layer 905 has been deposited. The diffusion barrier layer coats the substrate within the recess and in the field region.

Figure 9C:
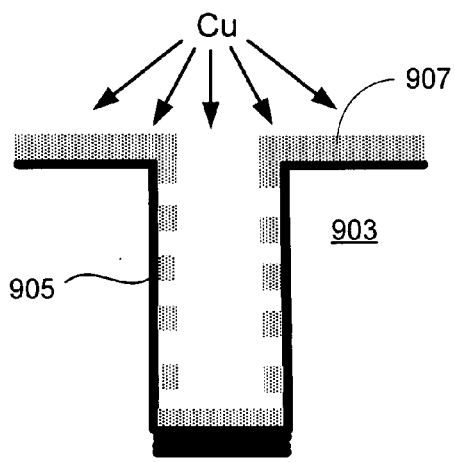

Referring again to the process flow diagram of FIG. 8, the substrate is transferred to a copper PVD deposition chamber equipped with a copper target, as shown by operation 803. In the copper deposition chamber a very thin layer of copper is deposited from the sputter target in an operation 805 to cover at least the bottom portion of the recessed feature. The deposited layer has a thickness of less than about 50 Å, preferably less than about 30 Å at the recess bottom, and is typically discontinuous on the sidewall. During copper deposition the following conditions can be used. Plasma is formed using a power of between about 30 and 110 kW applied to the target. RF bias at a power level of about 0-2000 W is applied to the wafer and the chamber pressure is maintained in the range of about 0.05-0.5 mTorr. The wafer temperature can be maintained between about −40 and 20° C. The formed device structure is illustrated in FIG. 9C, showing copper flux being directed from the copper target to form a thin copper layer 907 which is continuous on horizontal surfaces but is discontinuous on the sidewalls.

Next, in an operation 807, the deposited copper is resputtered from the bottom of the recessed feature onto the feature sidewall. The following conditions can be used during copper resputter. Plasma is formed using a power of between about 1 and 10 kW applied to the target. RF bias at a power level of about 600-2000 W is applied to the wafer and the chamber pressure is maintained in the range of about 0.5-10 mTorr. The wafer temperature can be maintained between about −40 and 20° C. After copper has been resputtered from the feature bottom, the coverage on the sidewall is substantially improved, particularly for the sidewalls having significant surface roughness. This is because the fluxes of copper that have been applied to the feature sidewall were applied from the opposite directions, and the shadowed portions of sidewall microrelief were therefore coated. In one embodiment, if copper coverage is sufficiently good, the process may end at this stage, a flash layer of copper may be applied to coat the recess bottom, and the structure may be subsequently electrofilled with copper.

Figure 9D:
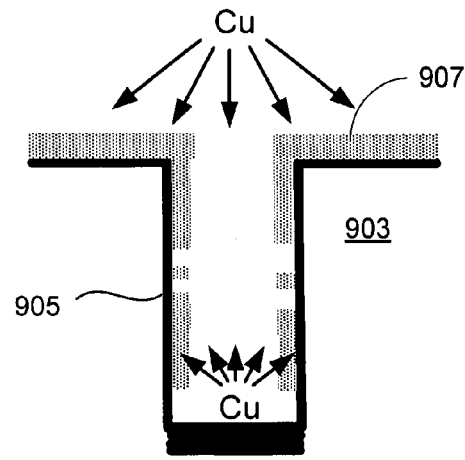
Figure 9E:
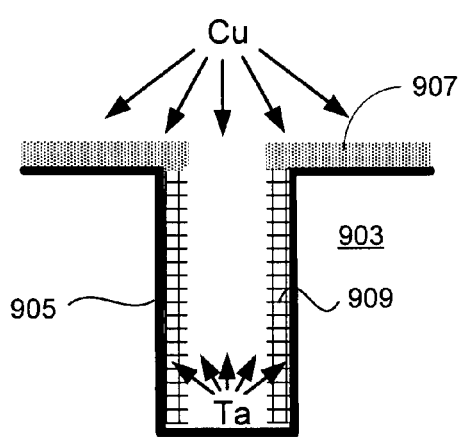

However, in many instances, due to high aspect ratio of the recessed features for example, the copper coverage on the sidewall will still be not sufficient at this stage, as shown by structure presented in FIG. 9D. FIG. 9D illustrates that the formed copper layer 907 is still not entirely continuous on the feature sidewall. Typically, uncoated regions will still remain at the middle of the sidewall, because they cannot be easily reached by the depositing and resputtering fluxes. It is also shown that copper has been entirely removed from the feature bottom, exposing the barrier layer.

The process then follows by resputtering the tantalum-containing material, such as Ta or $TaN_x$ from the bottom of the recess onto the sidewalls thereby depositing the barrier material onto the layer of copper residing on the sidewall and intermixing copper and tantalum on the sidewall, as shown in an operation 809. Simultaneously, a flux of copper may be directed from the target thereby resulting in further intermixing of copper and tantalum on the recess sidewall. In other embodiments, resputtering is performed in the absence of copper flux from the target.

Copper deposited on the sidewall is being physically trapped by the tantalum material, and an adhesion layer is formed. The conditions are adjusted such that the diffusion barrier material being resputtered onto the sidewall does not completely cover copper atoms residing on the sidewalls, such that the formed adhesion layer has exposed copper atoms on it surface. The result of operation 809 is illustrated by the device shown in FIG. 9E. An adhesion layer 909 is now residing on top of the diffusion barrier 905 on the feature sidewalls. The thickness of the barrier material residing at the recess bottom is decreased, however the diffusion material is not entirely removed from the recess bottom by the resputter operation, with at least about 10 Å of diffusion barrier material remaining at the feature bottom. Preferably, a resputtering operation removes less than about 90% of diffusion barrier material from the recess bottom. The process conditions used for diffusion barrier resputter are similar to conditions used during resputter of copper layer described for operation 807.

Figure 9F:
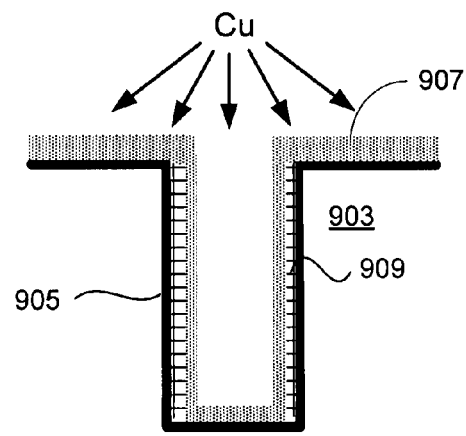

If further intermixing of copper and tantalum is needed to improve the properties of the diffusion barrier layer, operations 805-809 can be repeated at least once. For example a D(copper)/E(copper)/E(barrier)/D(copper)/E(copper)/E (barrier) sequence may be performed, wherein D refers to a net deposition at the feature bottom and E refers to net etch. In general, the sequence may stop at any point, e.g., after copper deposition, copper etch, or barrier etch, provided that the adhesion layer is formed on the feature sidewall. After the adhesion layer has been formed, a seed layer is deposited on top of the adhesion layer in an operation 813, resulting in a thin and conformal layer as desired. The process parameters used for seed layer deposition are similar to those described to copper layer deposition operation 805. The seed layer is typically deposited to a thickness of between about 200-400 Å in the field and to between about 30 and 60 Å on the sidewall. The device structure obtained upon completion of the process is shown in FIG. 9F. The device includes a thin conformal seed layer 907 covering the substrate in the field, at the recess bottom and on the sidewalls. In this example, the adhesion layer 909 resides only at the sidewalls without being present on horizontal surfaces. Presence of adhesion layer is most advantageous on the sidewalls where discontinuous seed layer is most often formed. However, in other embodiments the adhesion layer may also be formed on horizontal features. With the use of an adhesion layer the recesses may be lined with a copper seed layer without forming substantial overhang at the recess openings. This is because smaller amounts of copper need to be deposited to achieve continuous layer on sidewalls.

In different variations of the described above process sequence, resputtering operations 807 and 809 may or may not include a significant copper flux from the target. In some embodiments, copper deposition operation 805, and the resputtering operations 807 and 809 may include some net deposition of copper from the target on the recess sidewalls. In other embodiments, resputtering operations 807 and 809 do not significantly deposit copper from the target.

Figure 10:
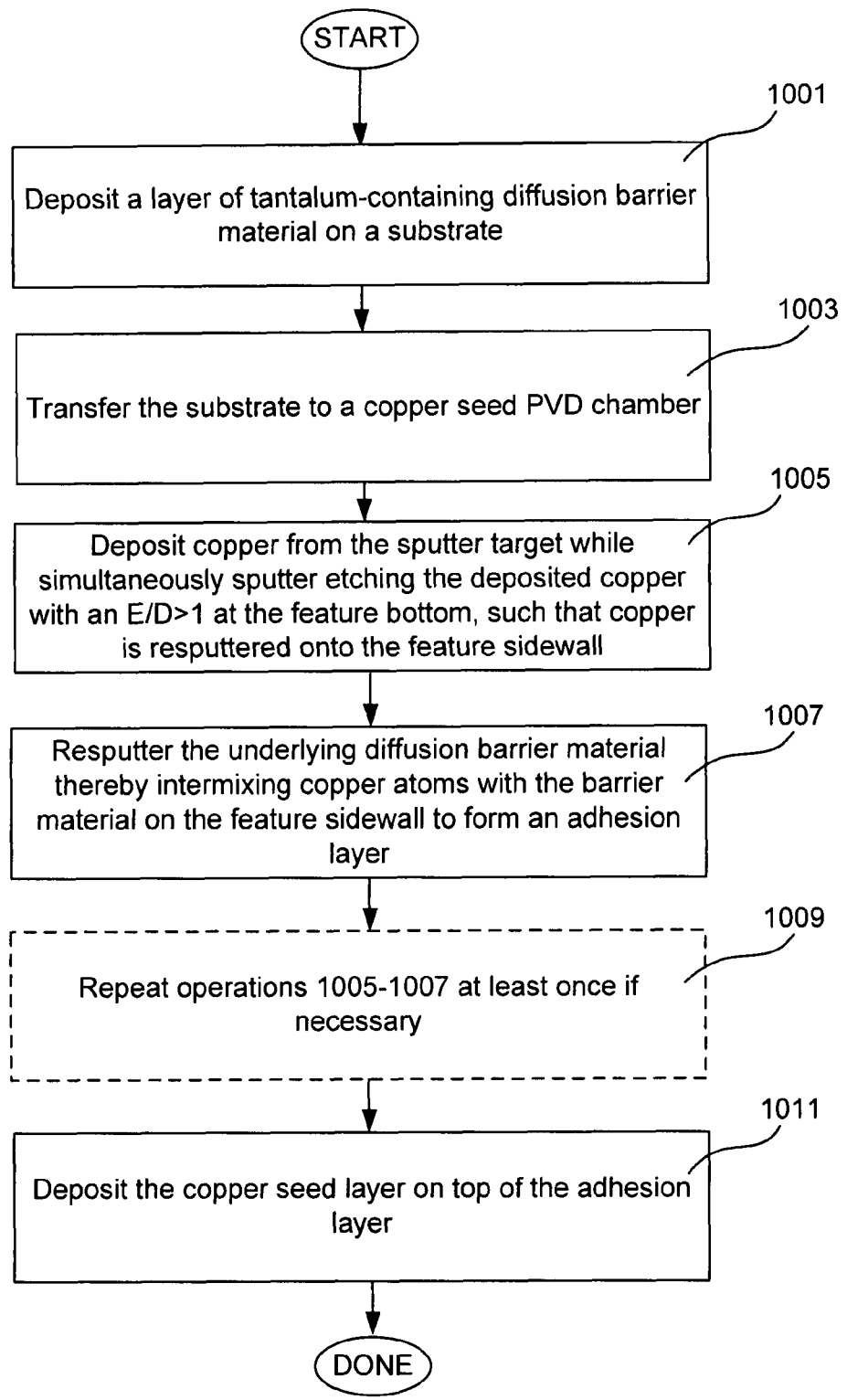
FIG. 10 presents an example process flow diagram for deposition of a copper seed layer according to an embodiment described herein. Deposition of adhesion layer in a copper deposition module is illustrated.

Another embodiment for forming an adhesion layer in a copper deposition PVD chamber, is illustrated by the process flow diagram shown in FIG. 10. The process starts analogously to the process described in FIG. 9 by depositing a layer of tantalum-containing diffusion barrier material on a substrate in an operation 1001 and by transferring the substrate to a copper seed PVD chamber in an operation 1003. Next, instead of performing sequential deposition and resputter of copper, the copper is simultaneously being deposited and resputtered with an E/D ratio of greater than 1 at the bottom of the recess, such that copper is resputtered onto the feature sidewall, as described by the operation 1005. Thus, in this embodiment no net deposition of copper is occurring at the feature bottom, but the copper is nevertheless conformally deposited on the feature sidewall through a resputter process. Example conditions for such instant resputtering are as follows. Plasma is formed using a power of between about 30 and 110 kW applied to the copper target. RF bias at a power level of about 300-2000 W is applied to the wafer and the chamber pressure is maintained in the range of about 0.05-0.5 mTorr.

The operation 1005 is used to deposit only a thin discontinuous layer of copper on the sidewall, having a thickness of, e.g., about 2-6 Å on the sidewall. The process then follows in 1007 analogously to the process described in FIG. 9, by resputtering diffusion barrier material from the feature bottom onto the feature sidewall to intermix copper and diffusion barrier material, and to thereby form an adhesion layer. If further intermixing in the adhesion layer is required, operations 1005 and 1007 are repeated at least once as shown in 1009. After the adhesion layer has been formed, the copper seed layer is deposited in an operation 1011.

The process sequences described in FIGS. 9 and 10 are particularly suitable for depositing copper seed layers on PVD-deposited barrier layers, because these processes include operations that are designed to coat the barrier layers having significant surface roughness. ALD-deposited barrier layers are typically very smooth and conformal and may be better coated using different process sequences, e.g., such as a process sequence described in the process flow diagram shown in FIG. 11. It is understood, however, that processes shown in FIGS. 9 and 10 are not limited to engineering the surface of PVD-deposited barrier and may be practiced on ALD-deposited layers as well. Further, the process described in FIG. 11 is not limited to engineering the surface of an ALD-deposited layer, and, in some embodiments may be practiced on PVD-deposited barrier layers.

Figure 11:
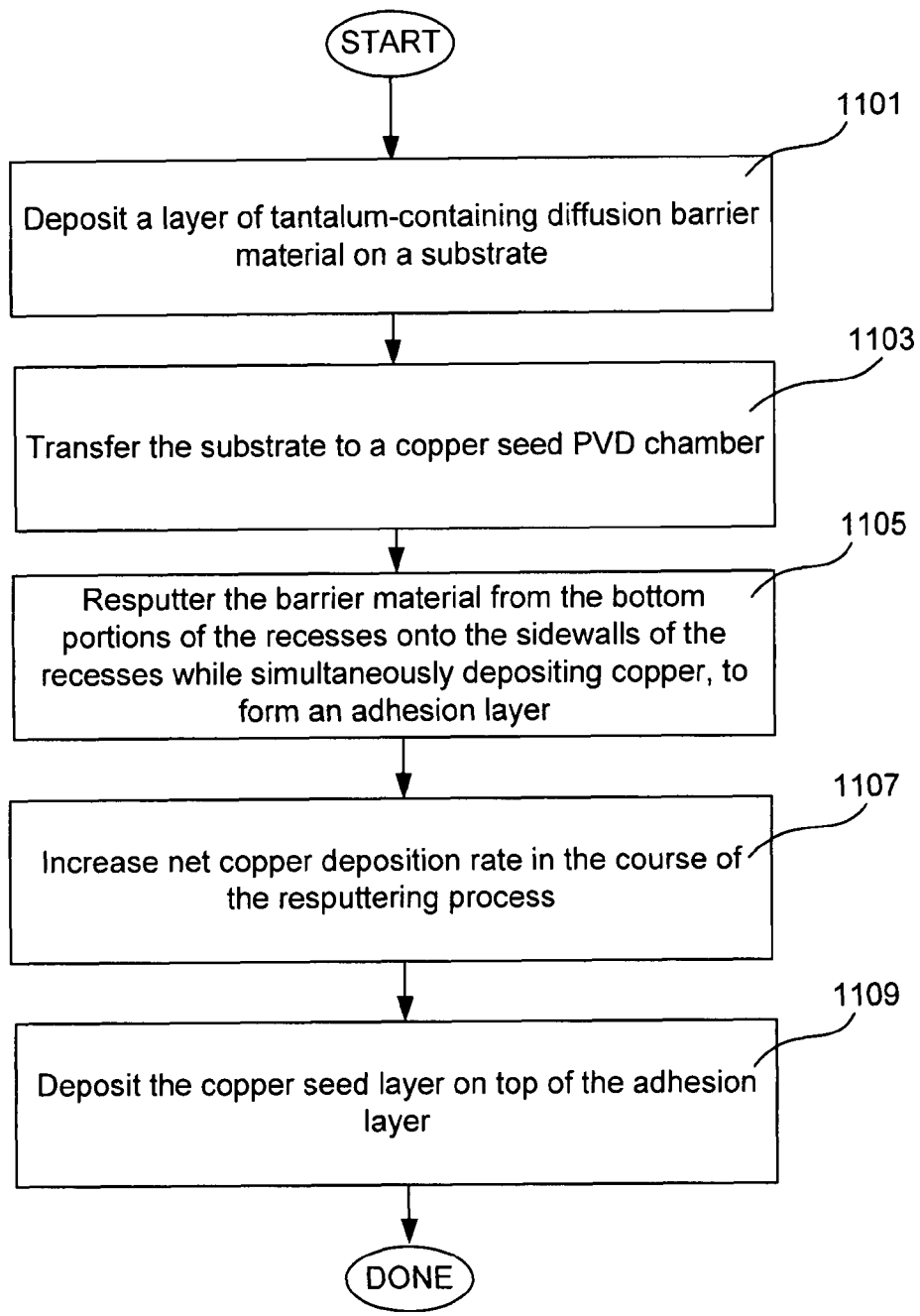
FIG. 11 presents an example process flow diagram for deposition of a copper seed layer according to an embodiment described herein. Deposition of adhesion layer in a copper deposition module is illustrated.

Referring to FIG. 11, the process begins by depositing a layer of tantalum-containing diffusion barrier material on a substrate in an operation 1101. The barrier layer may be deposited by PVD, ALD, CVD or PDL. In a particular embodiment the barrier layer is a smooth and conformal layer deposited by ALD (e.g. iALD). After the barrier material has been deposited, the substrate is transferred to a copper seed PVD chamber in an operation 1103, and the barrier material is resputtered from the bottom portions of recessed features onto the sidewalls while simultaneously depositing copper on at least the sidewalls, to form an adhesion layer, as shown in an operation 11. The flux of diffusion barrier material generated by resputter and the flux of copper directed from the target are simultaneously applied resulting in efficient intermixing of these materials on feature sidewalls. As resputtering proceeds, the net copper deposition rate is increased on the feature sidewall as shown in operation 1107. The net copper deposition rate can by increased, e.g., by increasing the target-generated copper flux. In one embodiment operation 1107 is performed by increasing the DC/RF ratio of power levels applied to the copper target and to the wafer. For example the process may start with a DC/RF ratio of about 0.5, which may gradually increase to about 100. In a particular example the process starts with a DC power applied to the target of about 1_kW, and the RF bias power applied to the wafer of about 1200 W. As the process proceeds, the DC power applied to the target may be increased to about 70 kW, while the RF bias power applied to the wafer can be decreased to 600 W. This will result in less material being resputtered from the feature bottom and more material being deposited from the target as the process proceeds, leading to formation of a well intermixed graded adhesion layer having a larger concentration of copper at the seed layer interface compared to the tantalum interface. The process follows by depositing a seed layer material on top of the adhesion layer material in an operation 1109 in a PVD copper seed chamber, as previously described. Alternatively the copper seed layer may be deposited using ALD.

The process sequences described in FIGS. 9-11 all involve forming the adhesion layer in a copper PVD chamber. These methods use the diffusion barrier material deposited at the feature bottom as a source of resputter-generated tantalum flux. In many embodiments these methods do not completely etch through the barrier layer at the feature bottoms. Therefore, these methods are particularly suitable for depositing seed layers on contact vias and on unlanded vias, which do not allow punch-through operations. Deposition of seed layers on landed vias in a dual Damascene region can be accomplished using methods described above or by using a process flow that makes use of a punch-through operation between the two metallization layers. Such method can be performed in a PVD deposition chamber equipped with a tantalum target. In this case, the target-generated flux will include tantalum, while the resputter-generated flux will include copper derived from copper lines underlying the landed vias in a dual Damascene region.

Figure 12:
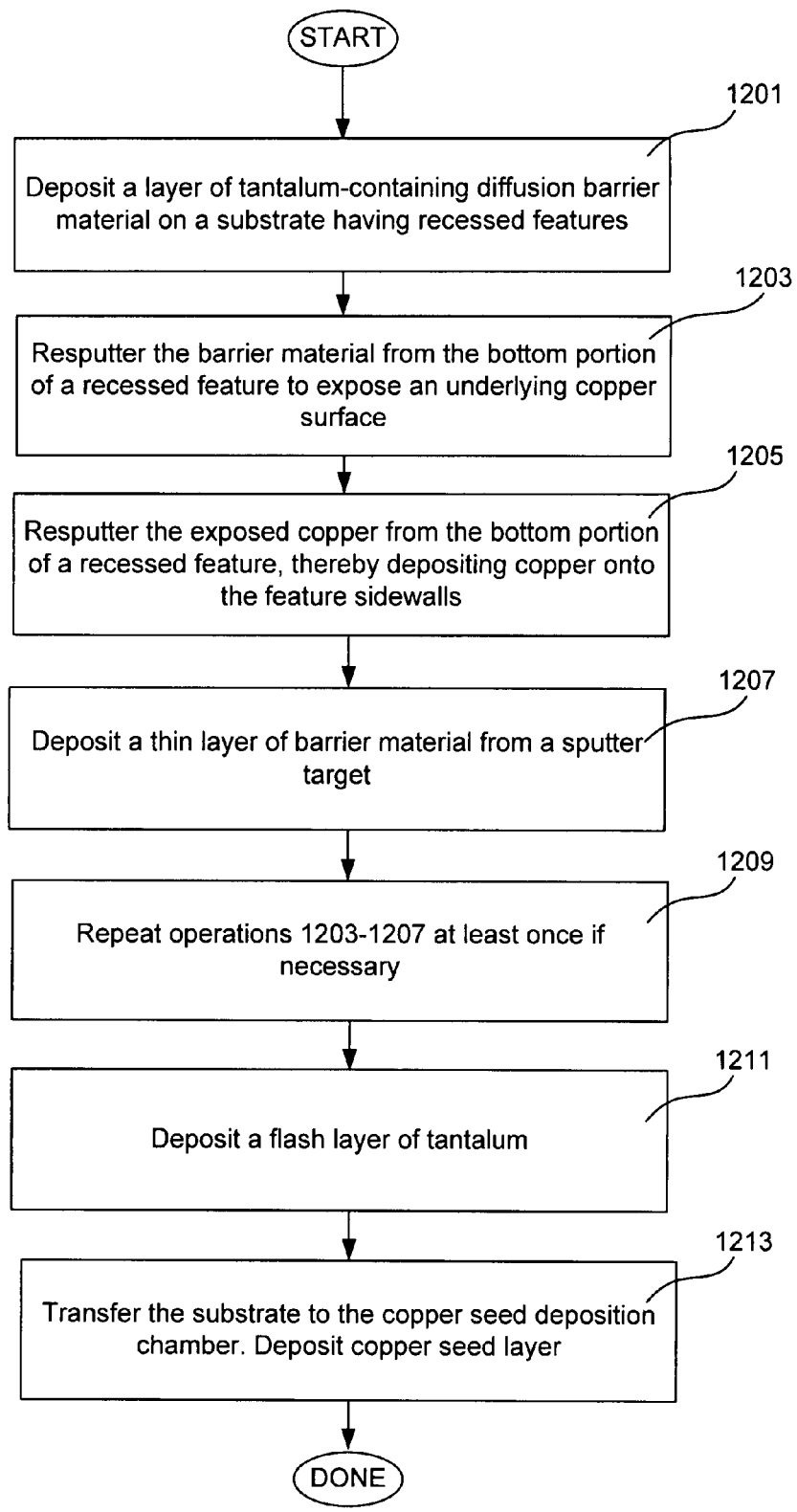
FIG. 12 presents an example process flow diagram for deposition of a copper seed layer according to an embodiment described herein. Deposition of adhesion layer in a tantalum deposition module is illustrated.
Figure 13A:
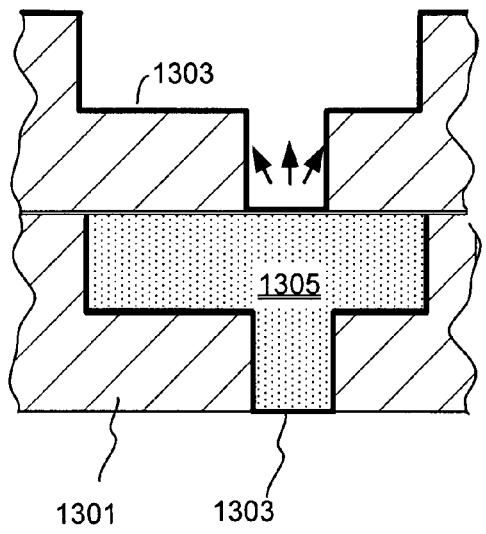
FIGS. 13A-13D present cross-sectional device structures obtained during deposition of a seed layer material according to a method described herein. Anchoring in a dual-Damascene structure is illustrated.

An example process flow diagram illustrating a method which involves forming an adhesion layer in a diffusion barrier deposition chamber is shown in FIG. 12. Cross-sectional depictions of device structures obtained during various stages of the process are illustrated by FIGS. 13A-13D. The process starts by depositing a tantalum-containing diffusion barrier material on a substrate having recessed features in an operation 1201. For example, a dual Damascene substrate having a top dielectric layer with etched vias and trenches and a bottom layer of dielectric with inlaid copper lines can be used. FIG. 13A illustrates a suitable dual Damascene substrate having a diffusion barrier layer deposited thereon. In this substrate, two layers of dielectric 1301 are stacked on top of each other. A copper filled line 1305 resides within the bottom layer of dielectric. A diffusion barrier layer 1303 resides between the copper line 1305 and the bottom dielectric layer 1301. The top dielectric layer includes a via and a trench. The via resides directly above the copper filled line 1305. A layer of diffusion barrier material 1303 lines the top layer of dielectric in the field, on the recess sidewalls and on the recess bottoms. The diffusion barrier layer can be deposited in a tantalum PVD chamber. The following example conditions can be used for depositing the tantalum layer. For a 300 mm wafer processed in an HCM, the DC power applied to the target is about 30 kW. The RF bias applied to the wafer is in the range of between about 0-1200 W. The pressure of about 2 mTorr can be used during deposition.

Figure 13B:
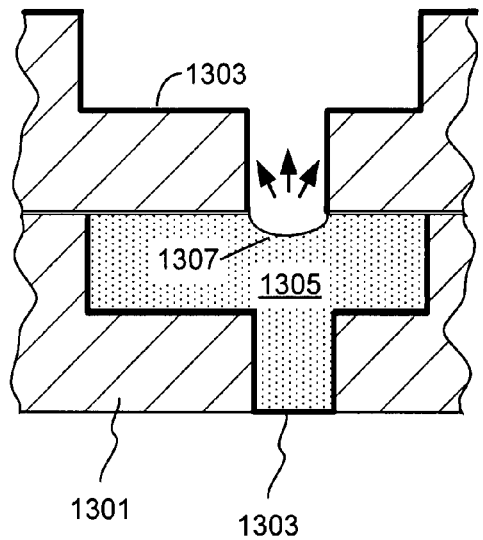

After the diffusion barrier material has been deposited, it is resputtered from the bottom portions of the recessed features to expose an underlying copper surface 1203. Preferably, deposition and resputtering are performed in the same process chamber. The resputtering proceeds further to remove the top portion of an underlying copper line and to deposit the resputtered copper onto the sidewalls of the recessed features, as shown in an operation 1205. Preferably, only a small amount of copper is resputtered in this operation, e.g., less than about 200 Å, preferably less than about 100 Å of copper is removed. Resputtering can be performed, according to one example, by applying a lower DC power to the target and a higher RF bias to the wafer. For example, a DC bias having a power level of about 1.5-8 kW can be applied to the wafer, while an RF bias at a power level of about 400-1200 W is applied to the wafer. The pressure of about 2 mTorr can be used. The resulting structure is shown in FIG. 13B, which illustrates the absence of a diffusion barrier at the via bottom and a small anchor recess formed within the metal line 1305.

Figure 13C:
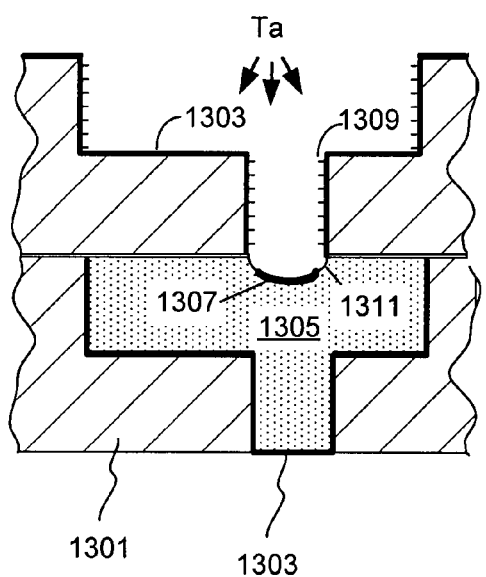

The process follows by depositing a thin layer of tantalum from the sputter target. Typically, less than about 50 Å of tantalum is deposited on the feature bottom. During deposition, the copper residing on the feature sidewalls becomes intermixed with tantalum and therefore forms an adhesion layer. The following example conditions can be used for depositing the tantalum layer. For a 300 mm wafer processed in an HCM, the DC power applied to the target is about 30 kW. The RF bias applied to the wafer is in the range of between about 0-1200 W. The pressure of about 2 mTorr can be used during deposition. FIG. 13C illustrates the resulting structure, in which an adhesion layer 1309 coats the sidewalls of the recesses, and a layer of tantalum barrier layer coats the bottom portion of the anchor recess 1307. It was noted that if only one cycle of deposition and resputter is performed during anchor recess formation, inadequate barrier coating of portions 1311 residing at the sidewalls of an anchor recess is achieved. In one embodiment a plurality of profiling cycles, each including an operation of depositing a thin barrier layer on the feature bottom and an operation of resputtering of the barrier material and the underlying copper material. Each profiling cycle deposits between about 5-50 Å of tantalum and removes all of the tantalum and between about 50-250 Å of copper from the via bottom resulting in a net etch of between about 50-250 Å of copper per profiling operation. In a typical process, operations 1203-1207 are repeated at least once, as shown in 1209. For example 1-8, preferably 4-6 profiling cycles can be performed. Note that a profiling cycle may start or end with a deposition or a resputter operation, depending on particular needs of the process. Provided methods can be used to form anchor recesses, while depositing well intermixed adhesion layers on feature sidewalls. Net removal of between about 50 and 500 Å of copper can be achieved during such anchor recess formation. Further, repetition of profiling cycles results in an improved shape of an anchor and in a continuous barrier coverage at the anchor sidewalls 1311 after a flash layer of tantalum is deposited. The profiling methods are described in detail in the commonly assigned U.S. patent application Ser. No. 11/807,179 entitled "Atomic Layer Profiling of Diffusion Barrier and Metal Seed Layers" naming Pradhan et al. as inventors, filed on the same day with the present patent application. U.S. patent application Ser. No. 11/807,179 is herein incorporated by reference in its entirety and for all purposes. Examples of suitable process flows include:

D(TaN)/D(Ta barrier)/E(Ta,TaN,Cu)/[D(Ta)E(Ta,Cu)]×N/D(Ta flash)

D(TaN)E(TaN)/[D(Ta barrier)/E(Ta,TaN,Cu)]×N/D(Ta flash)

D and E refer to net deposition and etching at a recess bottom respectively. N refers to a number of profiling cycles. In some embodiments between about 3-10 profiling cycles are preferred.

Figure 13D:
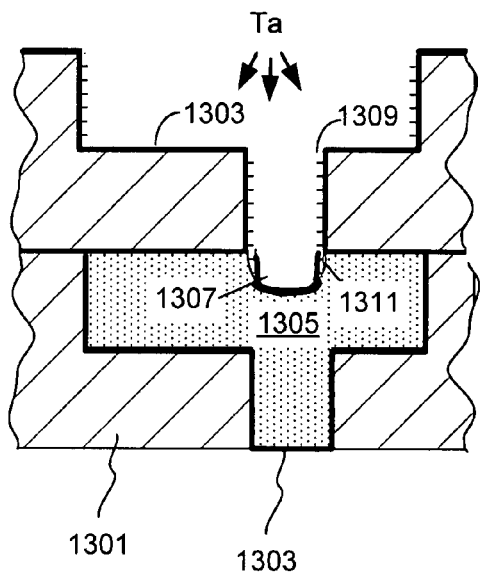

The deposition of a tantalum flash layer is performed after the profiling cycles 1209, as shown in an operation 1211. The tantalum flash layer is deposited only on horizontal surfaces of the substrate and does not cover the adhesion layer on the sidewalls. The tantalum flash layer has a thickness of about 10-30 Å at the anchor bottom. The flash layer deposited at the via bottom improves electromigration performance of formed devices. Further, the flash layer is deposited on the trench bottom, where it serves as a diffusion barrier. The resulting structure is shown in FIG. 13D. The adhesion layer 1309 coats the sidewalls of the recesses. The diffusion barrier layer coats the bottom of an anchor recess 1307 and sidewalls of an anchor recess 1311, as desired. The process then follows by transferring the dual damascene structure shown in FIG. 13D to a copper PVD chamber and by depositing a copper seed layer in an operation 1213. A thin conformal seed layer covering the substrate in the field and in the recesses (including the sidewalls and the anchor recess) is thus formed. The recesses are then electrofilled with copper and excess materials are removed from the field by CMP to complete the process.

The process sequence described in FIG. 12 can be modified in some implementations to perform resputtering and depositing operations simultaneously. For example, one embodiment involves depositing tantalum from the sputter target at the feature bottom, while simultaneously resputtering the material from the feature bottom onto the feature sidewall with an E/D ratio of greater than 1. Thus, in this implementation no net tantalum deposition is occurring at the feature bottom, while tantalum and copper are being resputtered from the feature bottom and are being intermixed on a feature sidewall to form an adhesion layer.

Another embodiment of the invention pertains to forming the adhesion layer in an ALD, e.g., in an iALD apparatus. ALD can be used for depositing both copper-containing seed layers and tantalum-containing diffusion barrier layers. In some embodiments, plasma enhanced ALD is used to perform resputtering. In a typical ALD process a thin layer of a barrier or seed precursor is adsorbed on a substrate surface and the adsorbed precursor is then reduced to form a barrier or seed material. Since adsorption of only one or several monolayers of material is possible, and because adsorption is a highly conformal process, very thin and highly conformal metal layers can be obtained. If thicker coverage is needed, several ALD cycles can be performed. An ALD apparatus and a process for depositing a tantalum-containing diffusion barrier material is described in the U.S. Pat. No. 7,144,806, naming Fair et al. as inventors, issued on Dec. 5, 2006, which is herein incorporated by reference in its entirety and for all purposes.

A variety of tantalum-containing precursors can be used, including organometallic tantalum compounds and tantalum halides. Organometallic tantalum-containing compounds which can be used in ALD include pentakisdimethylaminotantalum (PDMAT), pentakisethylmethylaminotantalum (PEMAT), trisdimethylaminotantalum (TBTDMT), and the like. Halide-containing tantalum precursors include $TaF_5$, $TaCl_5$, $TaBr_5$, or $TaI_5$. The reducing agent may include $NH_3$, $SiH_4$, $B_2H_6$, and the like. $TaN_x$, $TaSi_x$, and $TaB_x$ layers can be formed by cyclical introduction of precursors and reducing agents to the substrate.

Analogously, copper layers can be formed by adsorbing organometallic copper compounds or copper halides on a substrate and by reducing the precursors to form copper layers. Examples of copper precursors include but are not limited to bis(N,N'-di-sec-butylacetamidinato)copper, bis(N,N'-di-isopropylacetamidinato)copper, $Cu(thd)_2$, copper β-diketonates, CuI, $CuBr_2$, CuBr, CuCl, $CuI_2$, and the like. The reducing gas may include $H_2$, boranes, alkylboranes, etc. One skilled in the art will understand how to choose precursors and reducing agents for a particular process.

Figure 14:
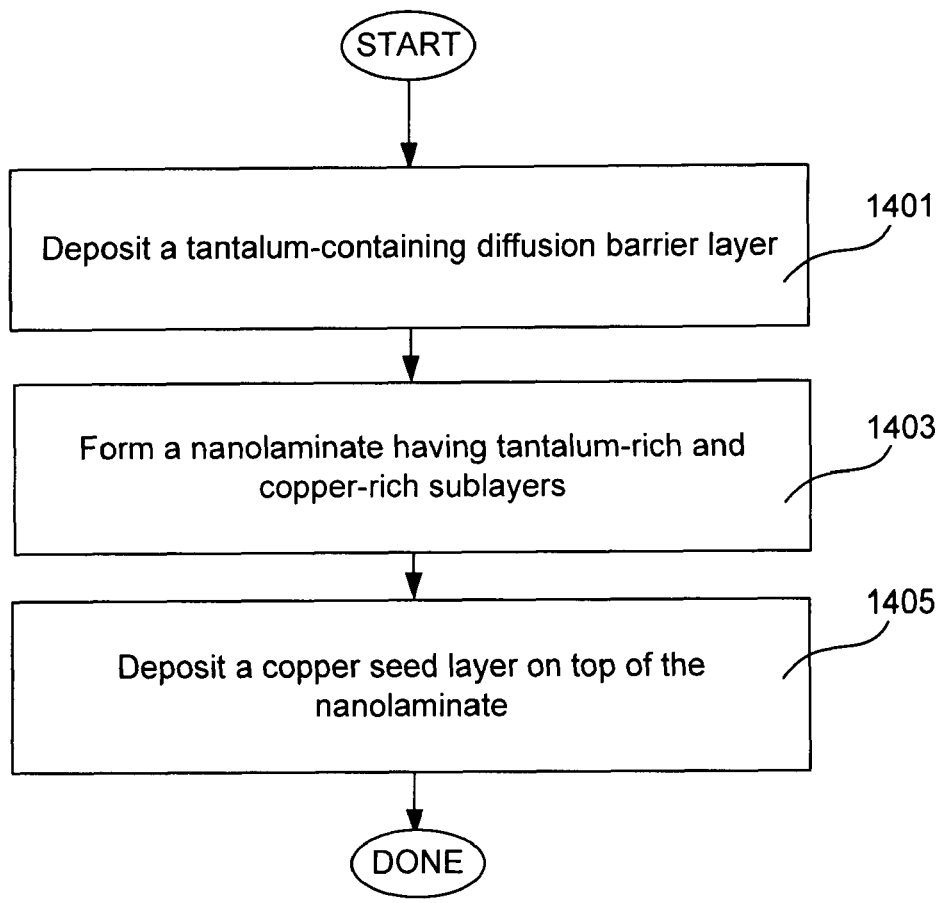
FIG. 14 presents an example process flow diagram for a method of depositing a seed layer using a nanolaminate adhesion layer.

Unlike PVD, ALD can deposit very thin, smooth and conformal layers of material. However, adhesion between ALD-deposited copper and tantalum layers is typically not as good as between the PVD deposited layers. The interface between these layers is engineered in one embodiment by forming a nanolaminate adhesion layer. The process sequence for this method is illustrated in FIG. 14.

The process starts by depositing a tantalum-containing diffusion barrier layer on a substrate having recessed features in an operation 1401. In one implementation the diffusion barrier material is deposited using ALD. Next, in an operation 1403 a nanolaminate having tantalum-rich and copper-rich sublayers is deposited. In general, the sublayers may be deposited by a number of available methods including PVD, ALD, CVD and PDL. Preferably, at least one of the sublayers, and, in some embodiments all of the sublayers in a nanolaminate are deposited using ALD, because it can provide very thin conformal coverage in a controlled fashion, one atomic monolayer at a time. In one particular embodiment, all copper-rich sublayers are deposited using ALD, while all tantalum-rich sublayers are deposited using PVD. Each sublayer in a nanolaminate is typically very thin, preferably between about 2-6 Å (around one atomic monolayer). In one embodiment sublayers having alternating compositions (tantalum-rich sublayers alternating with copper-rich sublayers) are stacked on top of each other such that adjacent sublayers are interwoven. In this approach, tantalum-containing material and copper are mixed within the nanolaminate, such that copper atoms are physically trapped. The top layer of a nanolaminate on which the copper seed layer is deposited is typically a copper-rich layer which provides copper adhesion sites for the subsequently deposited copper seed layer. The sublayer adjacent to the tantalum-containing diffusion barrier is typically tantalum-rich. The total thickness of formed nanolaminate is typically less than about 20 Å, e.g., about 5-15 Å. After the nanolaminate has been formed, a copper seed layer is deposited on top of the nanolaminate in an operation 1405. While in general any suitable method can be used to deposit the copper seed layer, in one implementation the copper seed layer is deposited using ALD.

In one implementation all of the operations 1401-1405 are performed in one ALD process chamber. An example interface obtained by the process shown in FIG. 14 can have the following structure: Ta(10 Å)/Ta(2 Å); Cu(2 Å); Ta(2 Å); Cu(2 Å)/Cu(10 Å). The structure is shown in the diffusion barrier/adhesion layer/seed layer format. The adhesion layer includes interwoven intermixed alternating copper and tantalum layers having a total thickness of 8 Å. Note, that $TaN_x$, can be used together with Ta or instead of Ta in these structures.

The described embodiments are presented as illustrative examples, and the invention is not limited by the described process sequences. One skilled in the art will recognize that engineering of the barrier/seed interface can be implemented using a number different combinations of deposition and resputter processes performed in a number of process chambers, such as PVD, CVD, ALD, PDL, iALD, and plasma preclean. For example copper and tantalum deposition can be performed using PVD, CVD, ALD, PDL and iALD. Resputtering operations can be performed in any apparatus that provides plasma suitable for resputtering. For example, plasma PVD, plasma preclean, and plasma enhanced ALD (iALD) process chambers can be used to perform resputtering. In some implementations, the process sequence, which includes barrier deposition, adhesion layer deposition and seed layer deposition, is performed in PVD process chambers. In other implementations, the entire sequence is performed in an ALD process chamber, and the adhesion layer includes a nanolaminate of ALD-deposited interwoven sublayers. In yet other implementations, the entire process sequence is performed in a plasma enhanced ALD chamber. In such chamber ALD deposition and ion-effected resputtering of deposited layers can be used to cause efficient intermixing between copper and diffusion barrier material in adhesion layers. In some embodiments, some of the layers may be deposited and/or resputtered using PVD, while other layers may be deposited using ALD. In some embodiments, copper-containing layers are deposited using ALD, while tantalum-containing layers are deposited using PVD.

The provided methods, in some embodiments, can be performed in cluster tools which may include one or more of PVD process chambers, ALD process chambers, and plasma pre-clean chambers. In some embodiments, the entire process sequence which involves barrier deposition, interface engineering, and seed layer deposition, is performed in a cluster tool without exposing the substrate to an ambient environment. For example, an INOVA™ cluster tool available from Novellus Systems Inc. of San Jose, Calif. can be used.

A variety of PVD process chambers can be used for depositing and resputtering operations used in the provided methods. For example, PVD process chambers that include a hollow cathode magnetron or a planar magnetron can be used.

Hollow cathode magnetron is an apparatus carrying a three-dimensional sputter target. The resputtering and depositing operations described herein are not limited to a specific cup-like geometry of an HCM target and can be used in conjunction with three-dimensional and planar targets of a plurality of shapes. Further, as mentioned, resputtering can be carried out in a plasma pre-clean chamber which typically does not include a sputter target and in a plasma enhanced ALD chamber.

Figure 15:
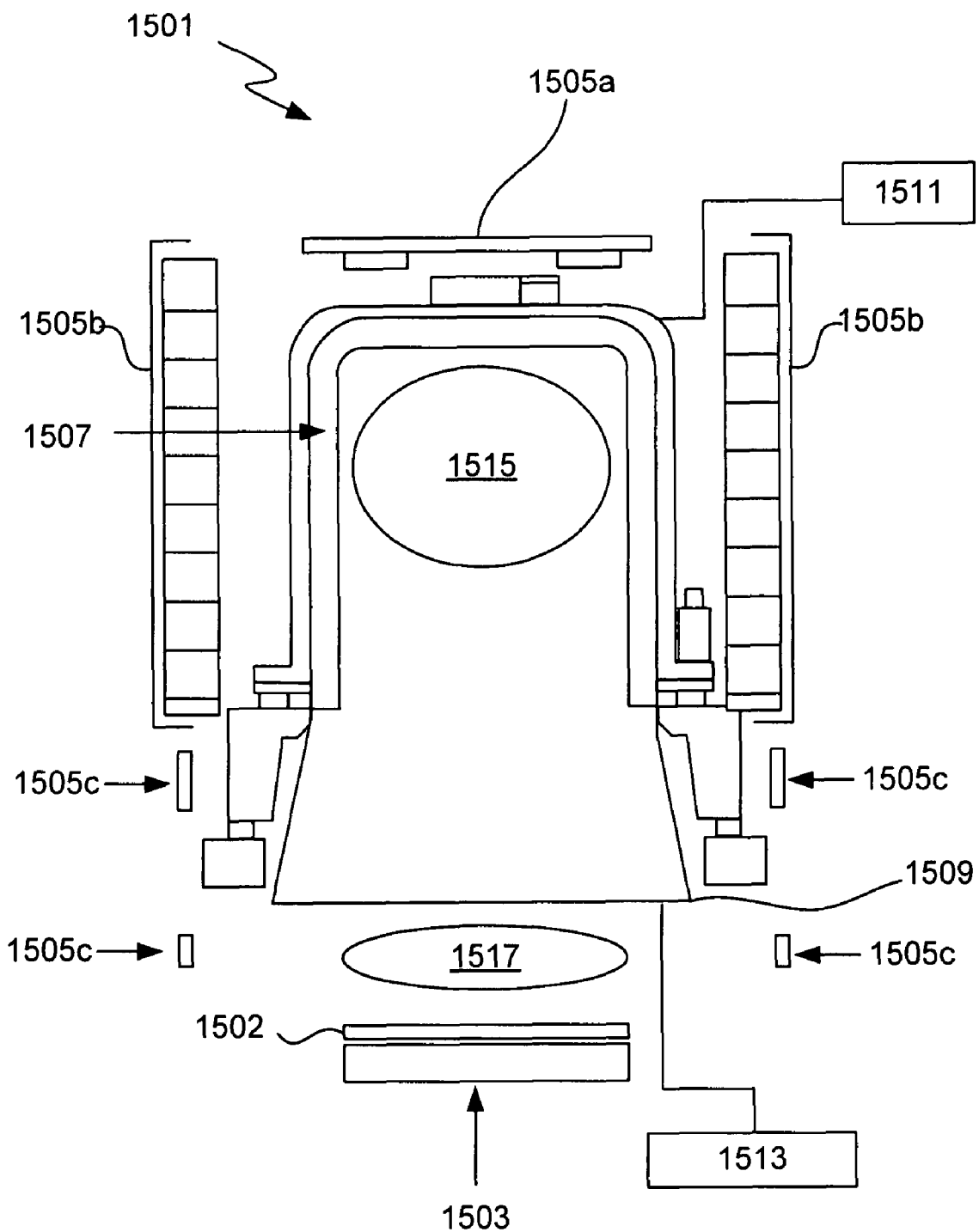
FIG. 15 is a cross sectional depiction of the hollow cathode magnetron (HCM) apparatus suitable for practicing methods described herein.

FIG. 15 presents a cross sectional view of one type of an HCM sputtering apparatus that can be used in accordance with the invention. The HCM apparatus has two main components, the source 1501, in which a plasma is created and maintained, and the RF bias electrostatic chuck (ESC) pedestal 1503, which secures the wafer 1502 and applies an RF bias on the wafer, if needed. In this example, the source 1501 contains a top rotating magnet 1505a, several side electromagnets 1505b-1505c, circumferentially positioned around the process chamber, and a sputter target 1507, operated at a negative DC bias. One or several shields may be positioned within the chamber next to the chamber sidewalls, to protect the sidewalls from the sputtered material. While the shield 1509 is often referred as an anode, this shield operates at a floating potential and is not additionally electrically biased.

The cathode target 1507 generally has a hollow cup-like shape so that plasma formed in the source can be concentrated within this hollow region. The cathode 1507 also serves as a sputter target and is, therefore, made of a metal material such as tantalum or copper, which is to be deposited onto a substrate.

An inert gas, such as argon, is introduced through a gas inlet into the hollow region of the cathode target 1507 powered by a DC source to form a plasma. The pump 1513 is positioned to evacuate or partially evacuate the process chamber. The control of pressure in the process chamber can be achieved by using a combination of gas flow rate adjustments and pumping speed adjustments, making use of, for example, a throttle valve or a baffle plate. The pressure used during deposition and resputter can range from between about 0.01 to about 100 mTorr. In some embodiments resputtering is performed at a higher pressure than deposition, e.g., deposition can be performed at pressures of less than about 1 mTorr, while resputtering can be performed in the pressure range of about 2-100 mTorr.

An intense magnetic field is produced by electromagnets 1505a-1505b within the cathode target region. Additional electromagnets 605c are arranged downstream of the cathode target so that different currents can be applied to each electromagnet, thereby producing an ion flux and a controlled deposition and/or etch rate and uniformity.

In one implementation, the polarity of the magnetic field generated by the electromagnetic coils 1505b and by the downstream electromagnets 1505c is selected to be opposite, such that a region of null magnetic field, known as a separatrix exists between the high density plasma 1515 and a region of plasma 1517 adjacent to the wafer surface.

Electromagnets 1505c arranged downstream of the cathode target are configured so that different currents can be applied to each electromagnet, thereby controlling an ion flux, deposition and/or etch rate and uniformity in the proximity of the wafer. A floating shield 1509, existing in equilibrium with the floating plasma potential, is used, in conjunction with the source electromagnets to shape the plasma distribution at the target mouth. The ESC pedestal 1503 holds the wafer substrate in place and can apply a RF bias to the wafer substrate. The ion energy, and therefore the deposition and/or etch rate can also be controlled by the pedestal RF bias.

An additional function of the ESC pedestal is to provide wafer temperature control during deposition and resputtering. In a typical process the pedestal temperature can vary in the range of about −50-600° C. In practice it is often advantageous to cool the wafer pedestal down to temperatures of about −40-10° C. while the shields of an apparatus are kept at a higher temperature of about 25-500° C., preferably 100-200° C. Typically, argon or helium backside gas is used to provide thermal coupling between the substrate and the ESC.

In certain embodiments, a system controller 1511 is employed to control process conditions during deposition and resputter, insert and remove wafers, etc. The controller will typically include one or more memory devices and one or more processors. The processor may include a CPU or computer, analog and/or digital input/output connections, stepper motor controller boards, etc.

In certain embodiments, the controller controls all of the activities of the deposition apparatus. The system controller executes system control software including sets of instructions for controlling the timing, mixture of gases, chamber pressure, chamber temperature, wafer temperature, RF power levels at the wafer, DC power levels at the target, polarity of electromagnetic coils 1505b and 1505c, power levels and current levels applied to the coils, wafer chuck or susceptor position, and other parameters of a particular process. Other computer programs stored on memory devices associated with the controller may be employed in some embodiments.

Typically there will be a user interface associated with controller 1511. The user interface may include a display screen, graphical software displays of the apparatus and/or process conditions, and user input devices such as pointing devices, keyboards, touch screens, microphones, etc.

The computer program code for controlling the deposition and resputtering processes can be written in any conventional computer readable programming language: for example, assembly language, C, C++, Pascal, Fortran or others. Compiled object code or script is executed by the processor to perform the tasks identified in the program.

The controller parameters relate to process conditions such as, for example, magnetic field within the chamber, plasma density within the chamber, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A plasma control program may include code for setting RF power levels applied to the wafer chuck and DC power levels applied to the target, as well as polarity parameters and current levels applied to different electromagnetic coils in an apparatus. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition and/or resputtering include mass flow controllers, pressure sensors such as manometers, and thermocouples located in pedestal or chuck. Appropriately programmed feedback and control algorithms may be used with data from these sensors to maintain desired process conditions.

In one embodiment, the controller includes instructions for performing the methods described herein. For example, the instructions in a copper seed deposition module can specify the parameters needed to deposit a thin layer of copper on a substrate surface, resputtering parameters, instructions for repeating these operations, and instructions for depositing a copper seed layer on top of the formed adhesion layer. The instructions in a tantalum deposition module can specify the parameters needed to deposit a thin layer of tantalum on a substrate surface, resputtering parameters, instructions for repeating these operations, instructions for forming an anchor recess, and instructions for depositing a flash layer of barrier material.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of depositing a copper seed layer on a semiconductor substrate having a plurality of recessed features, the method comprising:
   (a) providing a semiconductor substrate having a barrier layer residing at least on the bottom portions and on the sidewalls of the recessed features;
   (b) forming an adhesion layer over at least a portion of the barrier layer, wherein the adhesion layer comprises exposed copper atoms, and wherein forming the adhesion layer comprises
      (i) depositing a layer of copper at least over the barrier material residing in the bottom portions of the recessed features;
      (ii) resputtering the deposited copper from the bottom portions of the recessed features onto the sidewalls of the recessed features, thereby depositing copper atoms onto the layer of barrier material on the sidewalls; and
      (iii) resputtering the barrier material residing at the bottom portions of the recessed features onto the sidewalls of the recessed features, thereby intermixing the copper atoms with the barrier material on the sidewalls of the recessed features; and
   (c) depositing the copper seed layer on at least a portion of the adhesion layer, wherein the adhesion layer has a different composition from the seed layer and the barrier layer.

2. The method of claim 1, wherein the copper seed layer comprises a material selected from the group consisting of Cu, CuAl, CuZn, CuMg, CuSn, CuMn, CuAg, and CuB.

3. The method of claim 1, wherein the barrier layer comprises tantalum and/or tantalum nitride.

4. The method of claim 1, wherein (b) comprises applying a flux of a tantalum-containing material and a flux of a copper-containing material onto a substrate surface.

5. The method of claim 4, wherein at least one of the fluxes comprises a resputter-generated flux.

6. The method of claim 4, wherein the substrate surface comprises a recessed feature sidewall.

7. The method of claim 4, wherein the flux of the tantalum-containing material and the flux of the copper-containing material have substantially opposite directions.

8. The method of claim 4, wherein the flux of the tantalum-containing material and the flux of the copper-containing material are applied simultaneously.

9. The method of claim 4, wherein the flux of the tantalum-containing material and the flux of the copper-containing material are applied sequentially.

10. The method of claim 1, wherein the adhesion layer comprises copper atoms intermixed with the barrier layer material substantially over an entire sidewall surface of a recessed feature.

11. The method of claim 1, wherein the adhesion layer comprises copper in a concentration of between about 20% and 80% atomic.

12. The method of claim 1, wherein methods for depositing the barrier layer, forming the adhesion layer, and depositing the copper seed layer are independently selected from the group consisting of physical vapor deposition (PVD), atomic layer deposition (ALD), chemical vapor deposition (CVD) and pulsed deposition layer (PDL).

13. The method of claim 1, wherein (i) or (ii) is performed in a PVD chamber, in a plasma pre-clean chamber, in an iALD chamber, or in a plasma ALD chamber.

14. The method of claim 1, wherein (b) and (c) are performed in a copper seed layer PVD chamber.

15. The method of claim 1, wherein (i) comprises depositing a discontinuous layer of copper on the sidewalls of the recessed features.

16. The method of claim 1, wherein (i), (ii), and (iii) are repeated at least once.

17. The method of claim 1, wherein operations (i), (ii), and (iii) are performed in a copper seed PVD chamber.

18. The method of claim 1, further comprising depositing copper from a sputter target during at least one of operations (i), (ii) and (iii) on at least the sidewalls of the recessed features.

19. The method of claim 1, wherein the copper layer has a maximum thickness of less than about 50 Å at the bottom portions of the recessed features being resputtered, wherein the thickness refers to the thickness of the layer deposited during operation (i).

20. The method of claim 1, wherein resputtering the diffusion barrier layer does not entirely remove the diffusion barrier material from the bottom of the recessed feature.

21. The method of claim 1, wherein
   (i) and (ii) comprise depositing copper from the sputter target while simultaneously sputter etching the deposited copper, such that an etch rate to deposition rate ratio (E/D) at the bottom portions of the recessed features is greater than about 1.

22. A method, of depositing a copper seed layer on a semiconductor substrate having a plurality of recessed features, the method comprising:

(a) providing a semiconductor substrate having a barrier layer residing at least on the bottom portions of the recessed features;
(b) forming an adhesion layer over at least a portion of the barrier layer, wherein the adhesion layer comprises exposed copper atoms, wherein (b) comprises:
  (i) resputtering the barrier material from the bottom portions of the recessed features to expose an underlying copper surface;
  (ii) resputtering the exposed copper from the bottom portions of the recesses onto the sidewalls of the recesses, thereby depositing copper atoms onto a layer of barrier material on the sidewalls; and
  (iii) depositing a layer of barrier material from a sputter target on at least the exposed copper surface, without covering all of the exposed copper atoms of the adhesion layer residing on the sidewalls and
(c) depositing the copper seed layer on at least a portion of the adhesion layer, wherein the adhesion layer comprises copper intermixed with the barrier layer material; and wherein the adhesion layer has a different composition from the seed layer and the barrier layer.

23. The method of claim 22, wherein (b) further comprises:
  (iv) resputtering the barrier material deposited in (iii) from the bottom portions of the recessed features to expose an underlying copper surface;
  (v) resputtering the exposed copper from the bottom portions of the recesses onto the sidewalls of the recesses, thereby depositing copper atoms onto a layer of intermixed material on the sidewalls to achieve intermixing between copper atoms and barrier material atoms on the sidewalls of the recessed features.

24. The method of claim 23, further comprising repeating operations (iii), (iv), and (v) at least once to improve intermixing between copper atoms and barrier material atoms on the sidewalls of the recessed features.

25. The method of claim 24, wherein operation (iii) is performed 2-6 times.

26. The method of claim 23 further comprising:
  (vi) depositing a layer of barrier material on at least the bottom portions of the recessed features after (iv).

27. The method of claim 22, wherein the layer of deposited barrier material has a thickness of less than about 50 Å at the bottom of the recessed feature that is being resputtered.

28. The method of claim 22, wherein each resputtering operation (ii) removes less than about 200 Å of copper layer thickness from the bottom portion of the recessed feature.

29. A method, of depositing a copper seed layer on a semiconductor substrate having a plurality of recessed features, the method comprising:
  (a) providing a semiconductor substrate having a barrier layer deposited thereon;
  (b) forming an adhesion layer over at least a portion of the barrier layer, wherein the adhesion layer comprises exposed copper atoms, wherein forming the adhesion layer further comprises forming an anchor recess in an underlying metal line; and
  (c) depositing the copper seed layer on at least a portion of the adhesion layer, wherein the adhesion layer comprises copper intermixed with the barrier layer material; and wherein the adhesion layer has a different composition from the seed layer and the barrier layer.

30. The method of claim 29, wherein the depth of the anchor recess is between about 50 Å and 500 Å.

31. A method, of depositing a copper seed layer on a semiconductor substrate having a plurality of recessed features, the method comprising:
  (a) providing a semiconductor substrate with a barrier material residing at least on the bottom portions of the recessed features;
  (b) forming an adhesion layer over at least a portion of the barrier layer, wherein the adhesion layer comprises exposed copper atoms, and wherein (b) comprises:
    (i) resputtering the barrier material from the bottom portions of the recessed features to expose an underlying copper surface; and
    (ii) resputtering the exposed copper from the bottom portions of the recesses onto the sidewalls of the recesses, thereby depositing copper atoms onto a layer of barrier material residing on the sidewalls of the recessed features, wherein
  during at least operation (ii) a second portion of barrier material is being simultaneously deposited and sputter etched at the bottom of the recess with an E/D ratio of greater than about 1, such that sputter etching comprises resputtering the barrier material onto the sidewalls of the recessed features, thereby intermixing the barrier material with copper atoms in the adhesion layer; and
  (c) depositing the copper seed layer on at least a portion of the adhesion layer, wherein the adhesion layer has a different composition from the seed layer and the barrier layer.

32. A method, of depositing a copper seed layer on a semiconductor substrate having a plurality of recessed features, the method comprising:
  (a) providing a semiconductor substrate having a barrier layer deposited thereon;
  (b) forming an adhesion layer over at least a portion of the barrier layer, wherein the adhesion layer comprises exposed copper atoms, wherein forming the adhesion layer comprises forming a nanolaminate comprising barrier material sub-layers and copper sub-layers, wherein at least one sub-layer is deposited by ALD and
  (c) depositing the copper seed layer on at least a portion of the adhesion layer, wherein the adhesion layer has a different composition from the seed layer and the barrier layer.

33. The method of claim 32, wherein forming the nanolaminate comprises depositing at least one of the sublayers by a method selected from the group consisting of PVD, ALD, CVD, and PDL.

34. The method of claim 32, wherein the thickness of the nanolaminate is less than about 20 Å.

35. The method of claim 32, wherein the nanolaminate comprises at least one copper sub-layer deposited by ALD.

36. The method of claim 32, wherein the nanolaminate comprises at least one sub-layer of barrier material deposited by PVD.

37. The method of claim 32, wherein forming the nanolaminate comprises
  depositing alternating copper-rich and barrier material-rich sub-layers, wherein a barrier-rich sub-layer is deposited onto the exposed barrier layer of the provided substrate; and a copper-rich sub-layers is deposited as the top layer of the nanolaminate.

38. A method, of depositing a copper seed layer on a semiconductor substrate having a plurality of recessed features, the method comprising:
  (a) depositing a barrier material by ALD at least on the bottom and sidewall portions of the recessed features;
  (b) forming an adhesion layer over at least a portion of the barrier layer, wherein the adhesion layer comprises exposed copper atoms, and wherein (b) comprises resputtering the barrier material from the bottom portions of the recesses onto the sidewalls of the recesses, while simultaneously depositing copper in a copper PVD chamber, thereby intermixing copper atoms and barrier material on the sidewalls of the recessed features; and (c) depositing the copper seed layer on at least a portion of the adhesion layer, wherein the adhesion layer has a different composition from the seed layer and the barrier layer.

39. The method of claim 38, wherein during the resputtering the barrier material from the bottom portions of the recesses onto the sidewalls of the recesses, while simultaneously depositing copper in a copper PVD chamber a net copper deposition rate is increased in a course of the resputtering process.

40. The method of claim 38, wherein a ratio of DC power at a PVD target to RF power at a substrate pedestal (DC/RF) is increased during a course of the resputtering process in (b).

41. A method of depositing a copper seed layer on a semiconductor substrate having a plurality of recessed features, the method comprising:

(a) providing a semiconductor substrate having a barrier material layer residing at least on the bottom portions and on the sidewalls of the recessed features;

(b) forming an adhesion layer over at least a portion of the barrier layer, wherein the adhesion layer comprises exposed copper atoms, and wherein forming the adhesion layer comprises:

(i) depositing copper from the sputter target while simultaneously sputter etching the deposited copper, such that an etch rate to deposition rate ratio (E/D) at the bottom portions of the recessed features is greater than about 1, and wherein the etched copper atoms are resputtered onto the sidewalls of the recessed features, thereby being deposited onto the layer of barrier material on the sidewalls;

(ii) resputtering the barrier material residing at the bottom portions of the recesses onto the sidewalls of the recessed features, thereby intermixing the copper atoms with the barrier material on the sidewalls of the recessed features; and (c) depositing the copper seed layer on at least a portion of the adhesion layer, wherein the adhesion layer has a different composition from the seed layer and the barrier layer.

* * * * *